United States Patent
You et al.

(10) Patent No.: US 10,388,820 B2
(45) Date of Patent: Aug. 20, 2019

(54) METAL ORGANIC CHEMICAL VAPOR DEPOSITION APPARATUS FOR SOLAR CELL

(71) Applicant: LG ELECTRONICS INC., Seoul (KR)

(72) Inventors: Dongjoo You, Seoul (KR); Wonki Yoon, Seoul (KR); Heonmin Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 485 days.

(21) Appl. No.: 15/013,824

(22) Filed: Feb. 2, 2016

(65) Prior Publication Data

US 2016/0225933 A1 Aug. 4, 2016

(30) Foreign Application Priority Data

Feb. 3, 2015 (KR) .................. 10-2015-0016839
Mar. 31, 2015 (KR) .................. 10-2015-0044938

(51) Int. Cl.
*H01L 31/18* (2006.01)
*C23C 16/455* (2006.01)
*C23C 16/44* (2006.01)
*C23C 16/458* (2006.01)

(52) U.S. Cl.
CPC .......... *H01L 31/18* (2013.01); *C23C 16/4412* (2013.01); *C23C 16/4587* (2013.01); *C23C 16/45512* (2013.01); *C23C 16/45565* (2013.01)

(58) Field of Classification Search
USPC ...... 118/715, 725, 723 R; 156/345.35, 89.12, 156/345.34
See application file for complete search history.

(56) References Cited

U.S. PATENT DOCUMENTS

| 3,603,284 | A | | 9/1971 | Garnache | |
|---|---|---|---|---|---|
| 4,849,260 | A | * | 7/1989 | Kusumoto | C23C 16/14 257/E21.171 |
| 5,942,282 | A | * | 8/1999 | Tada | C23C 16/0281 257/E21.17 |
| 6,890,861 | B1 | | 5/2005 | Bosch | |
| 2008/0286075 | A1 | * | 11/2008 | Horii | B08B 7/00 414/147 |
| 2009/0044754 | A1 | | 2/2009 | Wieder et al. | |
| 2009/0218212 | A1 | * | 9/2009 | Denpoh | H01J 37/3244 204/164 |
| 2010/0193915 | A1 | | 8/2010 | Kishimoto et al. | |
| 2011/0230006 | A1 | | 9/2011 | Wieting et al. | |
| 2011/0283942 | A1 | | 11/2011 | Iwata et al. | |

(Continued)

FOREIGN PATENT DOCUMENTS

CN 201406469 Y 2/2010
CN 102127757 A 7/2011
(Continued)

*Primary Examiner* — Yewebdar T Tadesse
(74) *Attorney, Agent, or Firm* — Birch, Stewart, Kolasch & Birch, LLP

(57) ABSTRACT

A metal organic chemical vapor deposition apparatus for a solar cell includes a deposition unit. The deposition unit includes a susceptor to be mounted with a substrate, and a shower head to prepare a reacting gas by mixing plural kinds of raw gases for deposition and supply the reacting gas to the susceptor.

14 Claims, 11 Drawing Sheets

(56) References Cited

U.S. PATENT DOCUMENTS

| | | | |
|---|---|---|---|
| 2012/0006782 A1* | 1/2012 | Miyoshi | H01L 21/02063 216/13 |
| 2015/0184288 A1* | 7/2015 | Sasaki | C23C 16/4401 438/507 |
| 2015/0267294 A1* | 9/2015 | Itatani | C23C 16/4412 438/758 |

FOREIGN PATENT DOCUMENTS

| | | |
|---|---|---|
| CN | 102414799 A | 4/2012 |
| CN | 103074602 A | 5/2013 |
| JP | 2000-252218 A | 9/2000 |
| JP | 2010-65238 A | 3/2010 |
| KR | 10-2006-0084048 A | 7/2006 |
| KR | 10-2014-0034115 A | 3/2014 |
| KR | 10-2014-0103080 A | 8/2014 |
| WO | WO 2011/139039 A2 | 11/2011 |

* cited by examiner

METAL ORGANIC CHEMICAL VAPOR DEPOSITION APPARATUS FOR SOLAR CELL

CROSS-REFERENCE TO RELATED APPLICATION

This application claims the priority benefit of Korean Patent Applications No. 10-2015-00016839 filed on Feb. 3, 2015 and No. 10-2015-0044938 filed on Mar. 31, 2015 in the Korean Intellectual Property Office, the disclosures of which are incorporated herein by reference.

BACKGROUND OF THE INVENTION

1. Field of the Invention

The present invention relates to a metal organic chemical vapor deposition apparatus for a solar cell, and more particularly to a metal organic chemical vapor deposition apparatus for a solar cell, which has an improved structure.

2. Description of the Related Art

Recently, as existing energy resources such as petroleum and coal are depleted, interest in alternative energy sources is increasing. In particular, a solar cell is highlighted as a next-generation cell capable of converting solar energy into electric energy.

Such a solar cell may be manufactured by forming various layers and various electrodes in accordance with desired designs. In connection with this, the efficiency of the solar cell may be determined in accordance with the designs of the various layers and electrodes. For commercial availability of such a solar cell, it is necessary to overcome problems associated with low efficiency and productivity of the solar cell.

Various deposition apparatus may be used in forming various layers of a solar cell. In manufacture of solar cells, deposition apparatuses, which have been used in other technical fields, for example, in the fields of semiconductors or light emitting diodes (LEDs), are directly used. Since such deposition apparatuses are not suitable for manufacture of solar cells, it is not suitable for improvement of productivity and deposition uniformity of solar cells.

SUMMARY OF THE INVENTION

Therefore, the present invention has been made in view of the above problems, and it is an object of the present invention to provide a metal organic chemical vapor deposition apparatus for a solar cell, which is applicable to manufacture of solar cells so as to improve the productivity and deposition uniformity.

In accordance with an aspect of the present invention, the above and other objects can be accomplished by the provision of a metal organic chemical vapor deposition apparatus for a solar cell, including a deposition unit, the deposition unit including a susceptor to be mounted with a substrate, and a shower head to prepare a reacting gas by mixing plural kinds of raw gases for deposition and supply the reacting gas to the susceptor.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1A:
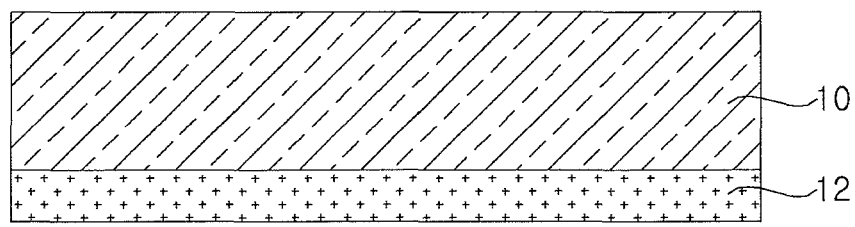
FIGS. 1A to 1E are cross-sectional views illustrating the method of manufacturing a solar cell, to which the metal organic chemical vapor deposition apparatus according to the embodiment may be applied.

Reference will now be made in detail to the embodiments of the present invention, examples of which are illustrated in the accompanying drawings. The present invention may, however, be embodied in many alternate forms and should not be construed as limited to the embodiments set forth herein.

In the drawings, illustration of parts having no concern with the present invention is omitted for clarity and simplicity of description. The same reference numerals designate the same or very similar elements throughout the specification. In the drawings, the thicknesses, widths or the like of elements are exaggerated or reduced for clarity of description, and should not be construed as limited to those illustrated in the drawings.

It will be understood that the terms "comprises" and/or "comprising," or "includes" and/or "including" when used in the specification, specify the presence of stated matters, but do not preclude the presence or addition of one or more other matters. In addition, it will be understood that, when an element such as a layer, film, region, or plate is referred to as being "on" another element, it can be directly disposed on another element or can be disposed such that an intervening element is also present therebetween. Accordingly, when an element such as a layer, film, region, or plate is disposed "directly on" another element, this means that there is no intervening element between the two elements. The terms "first", "second", "third", "fourth" and the like are used so as to merely distinguish one element from another element, and the embodiments of the present invention are not limited thereto.

Hereinafter, a metal organic chemical vapor deposition apparatus for a solar cell according to an embodiment of the present invention will be described in detail with reference to the accompanying drawings.

A solar cell and a method of manufacturing the same, to which the metal organic chemical vapor deposition apparatus according to the embodiment may be applied, is first described with reference to FIGS. 1A to 1E, and the metal organic chemical vapor deposition apparatus according to the embodiment is then described in detail with reference to FIGS. 2 and 3.

FIGS. 1A to 1E are cross-sectional views illustrating the method of manufacturing a solar cell, to which the metal organic chemical vapor deposition apparatus according to the embodiment may be applied.

As shown in FIG. 1A, a substrate 10 which includes a release layer (sacrifice layer) 12 formed on one side thereof is prepared. The substrate 10 may be made of compounds including Group IV elements, Groups III-V elements and Groups II-VI elements. For example, the substrate 10 may include a silicon (Si) substrate, a germanium (Ge) substrate, a gallium arsenic (GaAs) substrate, or the like. In particular, the substrate 10 according to the embodiment may be the gallium arsenide substrate.

The release layer 12 is the layer, which is etched after completion of subsequent growth of a compound semiconductor layer (14 in FIG. 1B, the same shall apply hereinafter). The release layer 12 may be made of various materials (for example, AlGaAs/InAlAs, InGaAs, AlAs, InGaP, InAlP, InGaAlAs, InP, or the like) which may be used in an epitaxial lift process.

Figure 1B:
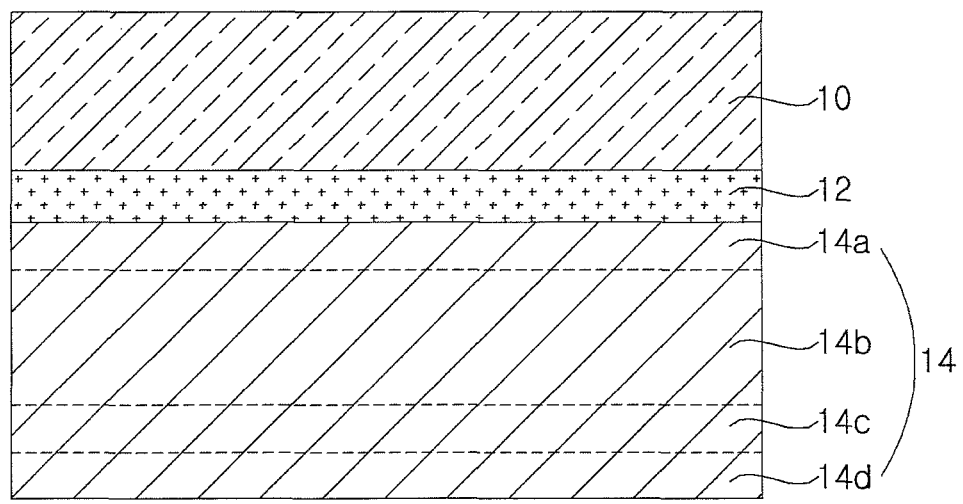

Subsequently, as shown in FIG. 1B, the compound semiconductor layer 14 having a p-n structure of a p-i-n structure is formed on the release layer 12. The drawing illustrates the compound semiconductor layer 14 which includes an n-type front surface electric field layer 14a, an n-type base layer 14b, a p-type emitter layer 14c and an n-type back surface field layer 14d which are sequentially layered in this order. In one example, the n-type front surface field layer 14a may include AlInP, the n-type base layer 14b may include an n-type GaAs, the p-type emitter layer 14c may include a p-type GaAs, and the p-type back surface field layer 14d may include a p-type GaInP. However, this is only one example. The compound semiconductor layer 14 may be composed of a plurality of semiconductor layers including Groups III-V elements and Groups II-VI elements.

In order to realize high efficiency, the compound semiconductor layer 14 (particularly, the n-type base layer 14b) may have a thickness of 2 um or greater. By way of example, the compound semiconductor layer 14 (particularly, the n-type base layer 14b) may have a thickness of 2 um-20 um. However, the present invention is not limited thereto, and may be embodied as various modifications.

Figure 1C:
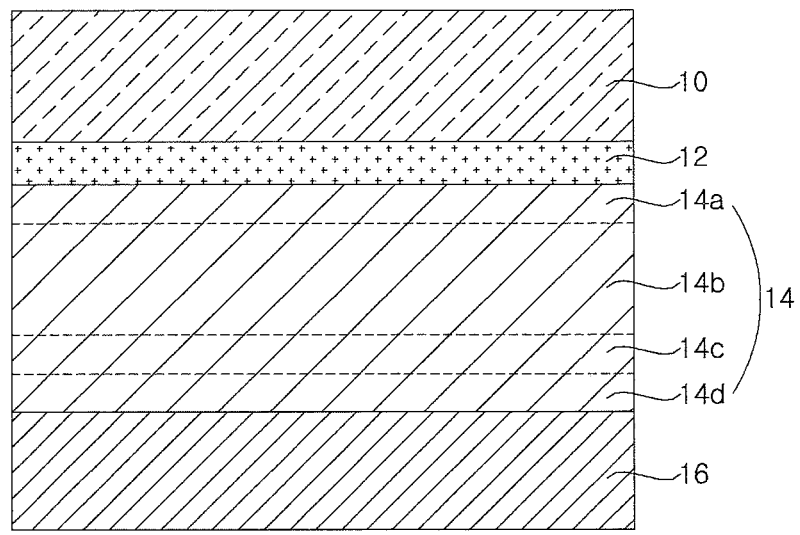

As shown in FIG. 1C, a back surface electrode 16 is formed on the compound semiconductor layer 14. The back surface electrode 16 may be made of various metals, which are well known in the art.

Figure 1D:
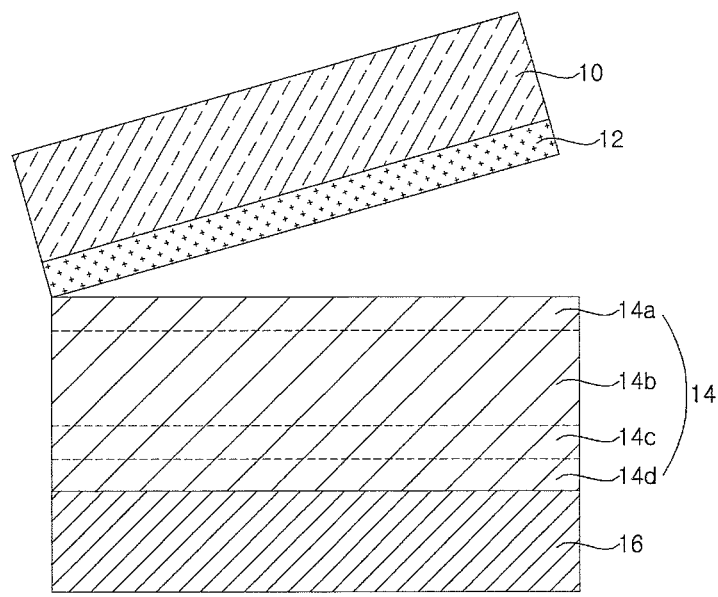

As shown in FIG. 1D, the substrate 10 is separated from the compound semiconductor layer 14 by etching the release layer 12. The etching of the release layer 12 may use various etchants, which are well known in the art.

Figure 1E:
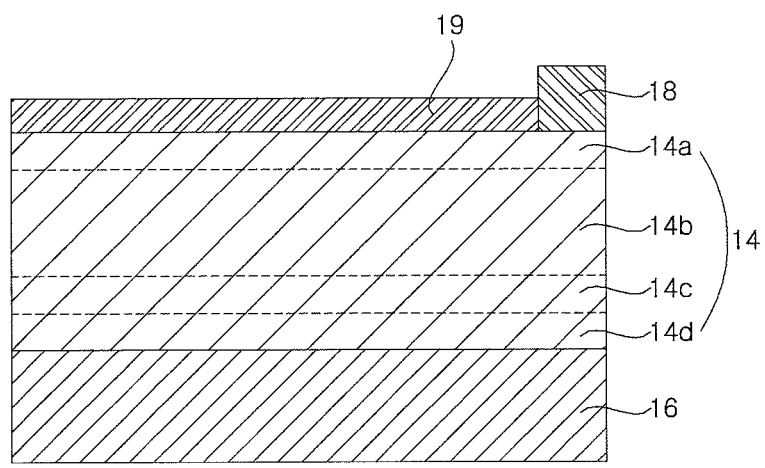

As shown in FIG. 1E, a front surface electrode 18 and an antireflection film 19 are formed on the other side of the compound semiconductor layer 14 (i.e. the side of the compound semiconductor layer 14 which is exposed by removing the substrate 10). The front surface electrode 18 may include a transparent conducting oxide (TCO) and/or a metal electrode which allows light to be transmitted therethrough. The antireflection film 19 may include various materials, laminated structures of the like, which are well known in the art. By way of example, the antireflection film 19 may be constituted by $MgF_2/ZnS$. However, the present invention is not limited thereto.

In the above-described method, the compound semiconductor layer 14 may be formed using the metal organic chemical vapor deposition apparatus. Specifically, the compound semiconductor layer 14 may be formed of a desired material in such a manner as to dispose the substrate 10 in a chamber, which is heated to a predetermined deposition temperature and supplying plural kinds of raw gases such as gas containing respective elements constituting the compound semiconductor layer 14, gas containing an n-type or p-type dopants and the like. The compound semiconductor layer 14 including the plurality of layers 14a, 14b, 14c and 14d is formed by changing the kinds, amounts or the like of the raw gases supplied in the deposition process.

In order to form a compound semiconductor layer 14 of a solar cell using a conventional technology, a metal organic chemical vapor deposition apparatus, which is adapted to manufacture light emitting diodes (LEDs), has been used. However, since the solar cell (particularly, compound semiconductor solar cell as described above) has properties and the like that are different from the light emitting diode, the conventional metal organic chemical vapor deposition apparatus, which is adapted to manufacture of the light emitting diodes, may not be suitable for manufacture of solar cells.

More specifically, the deposition process of manufacturing light emitting diodes is the heteroepitaxial process. For example, a deposited film constituted by GaN, which is highly different from a sapphire substrate ($Al_2O_3$) in lattice constant, properties and the like, has to be formed on the sapphire substrate which is a ceramic material. For this reason, the deposition process is performed at such a low deposition speed that the properties of the deposited film are maintained. Furthermore, since several tens of thousands of light emitting diodes may be produced from a single small-sized substrate (e.g. about 4 inches), it is critical to maintain excellent properties of the deposited film rather than productivity.

Furthermore, since the deposited film having properties, which are totally different from the substrate, has to be formed, the deposition process is performed at a temperature of 1100° C. or higher. Accordingly, plural kinds of raw gases have to be supplied to the inside of the chamber through respective pipes. Therefore, the structure of the pipes is complicated, thereby extremely complicating the structure of the deposition apparatus. Meanwhile, when plural kinds of raw gases in the mixed state are supplied to a susceptor or a substrate, the gases reacts to each other at a high temperature prior to deposition to the substrate, whereby the gases may not be deposited on the substrate. The susceptor, at which the substrate is positioned, has to be rotated in one direction and the substrate has to be rotated in the opposite direction such that the plural kinds of raw gases, which are individually supplied, are uniformly distributed. Since the deposition process has to be performed while the susceptor and the substrate disposed on the susceptor are rotated in opposite directions, the structure of the deposition apparatus becomes complicated and there is a difficulty in increasing the productivity by depositing the plurality of substrates simultaneously.

Meanwhile, since the compound semiconductor layer 14, which is constituted by a compound semiconductor, is developed or formed on the substrate 10, which is constituted by the compound semiconductor in the manufacture of the above-described compound solar cell, this process is equivalent to the homoepitaxial process. Accordingly, the properties of the compound semiconductor layer 14 are not greatly deteriorated even when the deposition speed is increased, and the deposition temperature may be lowered than the deposition temperature used in the manufacture of light emitting diodes. For example, the deposition temperature in the deposition apparatus according to the embodiment may be within a range of 650-800° C. (for example, 700-800° C.). Furthermore, since only one solar cell can be manufactured from one substrate 10 in the case of solar cell, it is necessary to improve the productivity by increasing the deposition speed.

Considering this, the metal organic chemical vapor deposition apparatus for a solar cell according to the embodiment, which is adapted to form the compound semiconductor layer 14 for the solar cell, has a structure, which is different from a conventional metal organic chemical vapor deposition apparatus for manufacturing light emitting diodes. The different structure will now be described in detail with reference to FIGS. 2 and 3.

Figure 2:
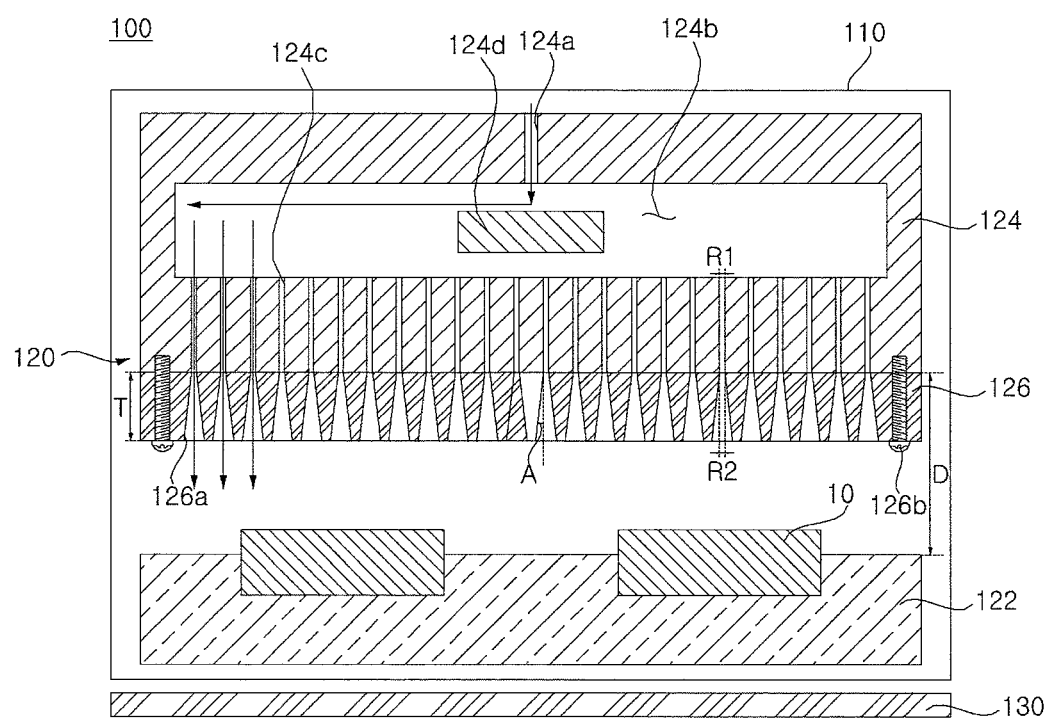
FIG. 2 is a schematic view showing the metal organic chemical vapor deposition apparatus for a solar cell, according to the embodiment of the present invention.
Figure 3:
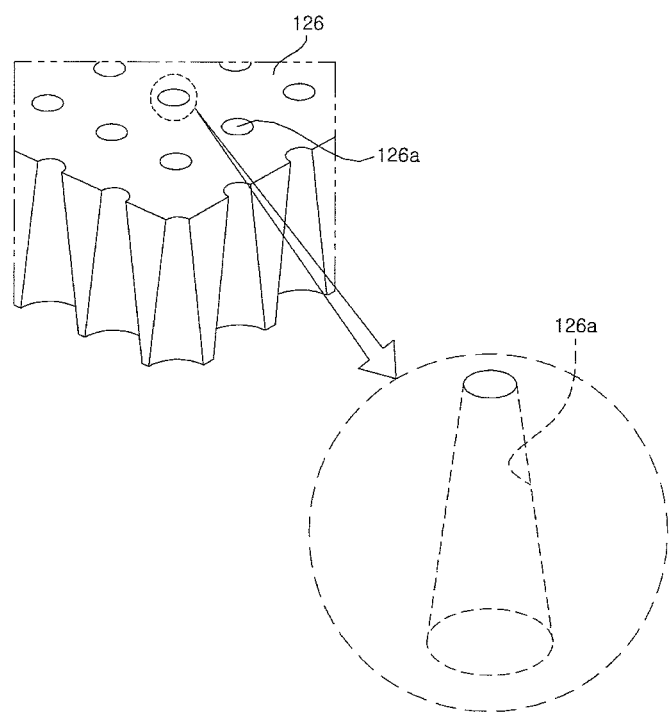
FIG. 3 is a fragmentary perspective view partially showing a thermal barrier of the metal organic chemical vapor deposition apparatus for a solar cell shown in FIG. 2.

FIG. 2 is a schematic view showing the metal organic chemical vapor deposition apparatus for a solar cell, according to the embodiment of the present invention.

Referring to FIG. 2, the metal organic chemical vapor deposition apparatus 100 for a solar cell, according to the embodiment of the present invention (hereinafter, referred to as "deposition apparatus") includes a chamber 110 having therein an internal space having a predetermined size, and a deposition unit 120, which is disposed in the chamber 110 so as to perform deposition. The deposition unit 120 includes a susceptor 122, on which a substrate 10 to be deposited, is mounted, a shower head 124 for supplying reacting gas to the susceptor 122, and a thermal barrier 126 disposed on the side of the shower heat 124 that faces the susceptor 122. The deposition apparatus may further include a heater 130 for heating the susceptor 122.

The chamber 110 provides a space, which is provided therein with the deposition unit 120 and in which the substrate 10 is deposited by the reacting gas, which is introduced into the space from the shower head 124. The chamber 110, in which the deposition unit 120 may be stably positioned, may isolate the deposition space from the outside and may include a structure, a material or the like, which is capable of enduring the deposition process conditions (i.e. high temperature and gas atmosphere). Although FIG. 2 illustrates an example in which a single deposition unit 120 is disposed in the chamber 110, the present invention is not limited thereto. In other words, a plurality of deposition units 120 are disposed in the chamber 110, this structure will be described in detail later with reference to FIGS. 4 and 5.

In this embodiment, the chamber 110 may be made of quartz glass. When the chamber 110 is made of quartz glass, the heat of the heater 130, which is disposed outside the chamber 110, may be transferred to the susceptor 122 through the chamber 110. However, the present invention is not limited thereto, and the chamber 110 may be made of other materials.

The susceptor 122 may have various structures on which the substrate 10 is placed. In this embodiment, the susceptor 122 may be maintained in the fixed state without being rotated. The substrate 10 may also be maintained on the susceptor 122 in the fixed state without being rotated.

As described above, since the deposition apparatus 100 according to the embodiment deposits the compound semiconductor layer 14 (see FIG. 1E, the same shall apply hereinafter), which is constituted by a compound semiconductor, on the substrate 10, which is constituted by semiconductor or a compound semiconductor, the deposition temperature may be relatively low. Accordingly, according to the embodiment, the shower head 124 creates a reacting gas which is prepared by mixing raw gases with each other, and supplies the mixed reacting gas to the susceptor 122 or the substrate 10 placed on the susceptor 122. Since the reacting gas, which is prepared by raw gases which are uniformly mixed, is supplied to the susceptor 122 or the substrate 10 in this way, the substrate 10 may uniformly react to the plurality of raw gases even though the susceptor 122 and the substrate 10 are maintained in the fixed state without being rotated. By virtue of the structure, which enables the susceptor 122 and the substrate 10 to be maintained in the fixed state without being rotated, it is possible to simplify the structure of the deposition apparatus 100 and to minimize the installation space. Furthermore, it is also possible to reduce costs of the deposition process. However, the present invention is not limited thereto, it is also possible to improve the uniformity of the deposition reaction by providing the construction capable of rotating the susceptor 122 and/or the substrate 10.

The susceptor 122 may be made of a material having excellent thermal conductivity so as to endure or withstand the deposition temperature and maintain the uniform temperature during the deposition process. Furthermore, the susceptor 122 may be surface-treated so as to minimize the reaction with the substrate 10. For example, the susceptor 122 may include a disk-shaped body constituted by graphite having excellent thermal conductivity, and a coating layer containing silicon carbide (SiC) capable of restricting the reaction with the substrate 10. However, the present invention is not limited thereto, the susceptor 122 may be constituted by various materials.

Here, one susceptor 122 may be provided with a plurality of substrates 10 placed thereon. In an example, 2 to 100 substrates 10 may be placed on the susceptor 122. The number of substrates 10, which are placed on one susceptor 122, may be variously modified.

The shower head 124, which is intended to supply reacting gas, is positioned so as to face the susceptor 122. In other words, the shower head 124 may be configured to have a surface area that is equal or similar to the entire area of the susceptor 122 such that the shower head 124 uniformly supplies the reacting gas to the substrate 10. The shower head 124 may be configured to have a plate shape perpendicular to the susceptor 122 or the substrate 10, whereby the reacting gas supplied from the shower head 124 may reach the substrate 10 in the direction perpendicular to the surface of the substrate 10.

The shower head 124 may include an injection port 124a through which plural kinds of raw gases are injected, an internal space 124b in which the plural kinds of raw gases are mixed with each other, and discharge holes 124c, which are formed in the surface thereof that faces the susceptor 122 and through which the gas mixture is discharged. The internal space 124b may be provided therein with a baffle 124d.

When the plural kinds of raw gases are injected through the injection port 124a, the raw gases are mixed with each other in the internal space 124b, and the reacting gas mixture is discharged through the discharge holes 124c due to the positive pressure caused by injection of the plural kinds of raw gases. The baffle 124d may control flow of the raw gases or reacting gas so as to uniformly mix the raw gases with each other, and may cause the reacting gas to be discharged through the discharge holes 124c due to the sufficient positive pressure. The baffle 124d may adopt various structures which are well known in the art.

The drawing illustrates an example which includes one injection port 124a and a plurality of discharge holes 124c. As a result, the structure can be simplified by minimization of the number of injection port 124a, the positive pressure in the internal space 124b can be efficiently increased, and the reacting gas can be uniformly discharged by the discharge holes 124c. However, the present invention is not limited thereto, and the numbers of injection port 124a and discharge holes 124c or the like may be variously modified.

When the positive pressure is applied to the internal space 124b, it is possible to uniformly discharge the reacting gas mixture through the discharge holes 124c. The positive pressure, which is generated in the internal space 124b, may be controlled by variation in an amount of injected raw gases, the diameter, the number and the disposition of the discharge holes 124c, and the like.

By way of example, the diameter (or the greatest width) R1 of the discharge holes 124c may be within a range of 100 um-1 mm. If the diameter R1 of the discharge holes 124c is less than 100 um, the reacting gas mixture may not be easily discharged. If the diameter R1 of the discharge holes 124c is greater than 1 mm, it may be difficult to generate the efficient positive pressure in the internal space 124b. Here, the discharge holes 124c may be arranged parallel in plural rows and columns with regular gaps therebetween so as to allow the reacting gas to be uniformly discharged.

The discharge holes 124c may be arranged at a density of $2/cm^2$-$10/cm^2$. If the density of discharge holes 124c is smaller than $2/cm^2$, the number of discharge holes 124c may be not sufficient, thereby deteriorating the uniformity of deposition process. If the density of the discharge holes 124c is larger than $10/cm^2$, it may be difficult to generate the sufficient positive pressure in the internal space 124b. However, the present invention is not limited thereto, and the diameter, the number, the disposition or the like of the discharge holes 124c may be variously modified.

In an example, the shower head 124 may be configured to have a rectangular parallelepiped shape with the internal space 124b defined therein. The injection port 124a may be positioned at the surface of the shower head 124 which face away from the susceptor 122, and the discharge holes 124c may be positioned at the surface of the shower head 124, which is opposite to the surface having the injection port 124a and faces the susceptor 122. Consequently, it is possible to efficiently increase the positive pressure in the internal space 124b and uniformly discharge the reacting gas through the discharge holes 124c. However, the present invention is not limited thereto, the positions of the injection port 124a and the discharge holes 124c may be variously modified.

As described above, since the deposition apparatus according to the embodiment is operated so as to deposit the compound semiconductor layer 14, which is constituted by a compound semiconductor, on the substrate 10, which is constituted by a semiconductor or a compound semiconductor, the deposition temperature may be relatively low. In an example, the deposition temperature of the deposition apparatus according to the embodiment may be within a range of 650-800° C. (for example, 700-800° C.). Therefore, according to the embodiment, even though reacting gas mixture, which is prepared by mixing raw gases with each other in the shower head 124, is supplied to the susceptor 122 or the substrate 10 placed on the susceptor 122, there is no problem whereby the reacting gas reacts prior to reaching the substrate 10. Considering this problem, since the deposition apparatus 100 according to the embodiment adopts the shower head 124, which is constructed to have the injection port 124a, the internal space 124b and the discharge holes 124c, it is possible to uniformly supply the reacting gas in the mixed form and to simplify the structure for supplying the reacting gas. When the reacting gas, containing plural kinds of raw gases, required for deposition reaction are supplied in an unmixed form as in a conventional apparatus, it is common to improve the uniformity of deposition reaction by rotating the substrate and the susceptor. In contrast, since this embodiment is configured so as to enable plural kinds the reacting gas, which is prepared by mixture of plural kinds of raw gases, to reach the substrate 10, there is no need to rotate the substrate 10 and the susceptor 122.

For the deposition of the compound semiconductor layer 14, the reacting gas may include gas containing the elements constituting the compound semiconductor layer 14, gas containing dopants so as to exhibit the n-type or p-type property, carrier gas and the like. In an example, the embodiment may deposit the n-type or p-type compound semiconductor layer 14 containing Groups III-V semiconductors. For example, when it is intended to form a layer containing Gallium Arsenic (GaAs) in the compound semiconductor layer 14, gas containing Gallium (e.g. trimethylgallium (TMGa)) and gas containing arsine (AsH3) may be used. Here, gas containing boron may be included in the case of intending to form a p-type layer, and gas containing phosphorus may be included in the case of intending to form an n-type layer. Various carrier gases, which are well known in the art, may be used as the carrier gas. In addition, other various gases may further be included.

In the embodiment, the thermal barrier 126 may be disposed on the surface of the shower head 124 that faces the susceptor 122. The thermal barrier 126 serves to prevent the temperature of the shower head 124 from increasing during the deposition process, thereby assuring the reliable implementation of deposition process. The description regarding this will be described in detail later.

In the embodiment, the heater 130 may be disposed at a location at which the susceptor 122 can be heated from the outside or inside of the chamber 110. Consequently, the deposition process is performed after the susceptor 122 is heated by the heater 130 and the temperature of the substrate 10 placed on the susceptor 122 is increased.

The heater 130 may adopt various structures, ways or the like, which are able to heat the susceptor 122. The heater 130 is illustrated in the drawing as being positioned outside the chamber 110. A resistance heater, a lamp heater or the like may be used as the heater 130. Application of the lamp heater enables heating and cooling in a short period of time, thereby offering reduction of process time and improvement of productivity. However, the present invention is not limited thereto. The heater 130 may be constituted by a resistance heater or the like, which is disposed in the susceptor 122. However, the present invention is not limited thereto.

The heater 130 serves to heat the susceptor 122 so as to cause the substrate 10 placed on the susceptor 122 to reach a predetermined deposition temperature while the deposition occurs in the deposition apparatus 100. Under the conditions, when the plural kinds of raw gases are injected into the internal space 124b through the injection port 124a of the shower head 124, the raw gases are mixed with each other in the internal space 124b, and the reacting gas mixture is supplied to the substrate 10 through the discharge holes 124c. Consequently, the reacting gas, which has reached the substrate 10, creates the deposited film, which will serve as the compound semiconductor layer 14, on the substrate 10.

Meanwhile, when the heat from the susceptor 122 is transferred to the shower head 124, the plural kinds of raw gases disposed in the shower head 124 may react with each other and may thus form a reaction product. The reaction product may be deposited in the discharge holes 124c, thereby clogging the discharge holes 124c. In particular, when the distance between the shower head 124 and the susceptor 122 or the substrate 10 is decreased for the purpose of high-speed deposition, the problem of clogging the discharge holes 124c during the deposition process may become more serious. Since there may be a problem in the deposition process due to transfer of the heat of the susceptor 122 to the shower head 124, the embodiment provides the surface of the shower head 124 that faces the susceptor 122 with the thermal barrier 126 in order to prevent the heat transfer.

In the embodiment, the distance D between the susceptor 122 and the shower head 124 may be within a range of 10-100 mm. If the distance D between the susceptor 122 and the shower head 124 is less than 10 mm, the reacting gas may be transferred to the substrate 10 in the pattern of the discharge holes 124c of the shower head 124 without widely spreading, thereby deteriorating the uniformity of the deposited film. If the distance D between the susceptor 122 and the shower head 124 is greater than 100 mm, the amount of the reacting gas, which is pumped without reacting with the substrate 10, may increase, thereby making it difficult to implement the high-speed deposition. However, the present invention is not limited thereto, and the distance D between the susceptor 122 and the shower head 124 may be modified so as to have other values.

The thermal barrier 126 may be made of a material which has a thermal conductivity less than the shower head 124 and the susceptor 122. When the shower head 124 has a high thermal conductivity which enables efficient cooling, it is possible to prevent a problem whereby the reaction product from the raw gases and the reacting gas adheres to the shower head 124. As described above, the susceptor 122 has a high thermal conductivity so as to uniformly maintain the temperature of the substrate 10. In contrast, the thermal barrier 126 may have a low thermal conductivity so as to prevent the heat from the susceptor 122 from being transferred to the shower head 124.

In an example, the shower head 124 may be made of a metal having excellent thermal conductivity (e.g. aluminum or stainless steel). As described above, the susceptor 122 may include a body made of graphite. The thermal barrier 126 may be made of an insulating material (e.g. ceramic, quartz or the like), which has a lower thermal conductivity than aluminum, stainless steel, graphite or the like. Alumina ($Al_2O_3$), silica ($SiO_2$) or the like may be used as the ceramic material.

The thermal barrier 126 may be configured to have a plate shape having a larger area so as to correspond to the surface of the shower head 124. The thermal barrier 126 may be secured to the surface of the shower head 124 in various ways. For example, the thermal barrier 126 may be secured to the shower head 124 by thread fastening by means of screws 126b. The thread fastening enables the thermal barrier 126 to be firmly secured by a simple structure.

In one example, the thermal barrier 126 may have a thickness T of 3 mm-30 mm. If the thickness T of the thermal barrier 126 is less than 3 mm, sufficient heat shielding effect may not be obtained. If the thickness T of the thermal barrier 126 is greater than 30 mm, the high-speed deposition may become difficult due to increase in distance between the susceptor 122 and the shower head 124. However, the present invention is not limited thereto, and the thickness of the thermal barrier 126 may have various values depending on the constituent material of the thermal barrier 126.

The thermal barrier 126 may have through holes 126a, which communicate with the discharge holes 124c of the shower head 124 so as to allow gases to pass therethrough. In an example, the through holes 126a may be provided in one-to-one correspondence with the discharge holes 124c. When the through holes 126a are provided in one-to-one correspondence with the discharge holes 124c, the reacting gas, which has passed through the discharge holes 124c, can be transferred to the substrate 10 or the susceptor 12 while spreading along the shape of the through holes 126a.

Each of the through holes 126a may have a configuration in which a diameter (or width) or a cross-sectional area is larger in the end that is close to the corresponding discharge hole 124c than the opposite end that is positioned opposite the corresponding discharge hole 124c (i.e. that is close to the susceptor 122). In an example, the through hole 126a may be configured to have a shape in which a diameter or a cross-sectional area is continuously increased from the end that is close to the discharge hole 124c toward the opposite end that is positioned opposite the discharge hole 124c. For example, the through hole 126a may be configured to have a conical shape, as shown in FIG. 3. Consequently, the reacting gas may spread along the through hole 126a, and may reach the susceptor 122 or the substrate 10 in a uniform fashion.

For the purpose of creation of a sufficient positive pressure, the raw gases are supplied to the shower head 124 in a jet-flow fashion. Subsequently, the raw gases reach the substrate 10 in the jet-flow fashion, and are deposited on the substrate 10 in a pattern corresponding to the discharge holes 124c of the shower head 124, with the result that the uniformity of the deposited film or compound semiconductor layer 14 may be greatly deteriorated. Considering this, by virtue of the shape of the through holes 126a formed in the thermal barrier 126, it is possible to allow the reacting gas to widely diffuse.

In the embodiment, the diameter (or width) R2 of the end of the through hole 126a that is close to the discharge hole 124c may be equal or similar to the diameter (or width) R1 of the discharge hole 124c. When the diameter R2 of the end of the through hole 126a that is close to the discharge hole 124c is equal or similar to the diameter R1 of the discharge hole 124c, the reacting gas may widely spread in a fashion similar to the surface of the side surface of the through hole 126a due to the friction with the side surface of the through hole 126a, thereby improving the uniformity of the deposited film or compound semiconductor layer 14. For example, the diameter R2 of the end of the through hole 126a that is close to the discharge hole 124c may be 90-110% of the diameter R1 of the discharge hole 124c. This value range was determined in consideration of process error, diffusion of the reacting gas and the like.

If the diameter R2 of the end of the through hole 126a that is close to the discharge hole 124c is considerably greater than the diameter R1 of the discharge hole 124c (for example, if the diameter R2 of the end of the through hole 126a that is close to the discharge hole 124c exceeds 110% of the diameter R1 of the discharge hole 124c), the reacting gas passes through the through hole 126a in the jet-flow fashion and reaches the susceptor 122 or the substrate 10. For this reason, the uniformity of the deposited film may be deteriorated. Meanwhile, if the diameter R2 of the end of the through hole 126a that is close to the discharge hole 124c is considerably less than the diameter R1 of the discharge hole 124c (for example, if the diameter R2 of the end of the through hole 126a that is close to the discharge hole 124c is less than 90% of the diameter R1 of the discharge hole 124c), it may be difficult for the reacting gas to be supplied to the susceptor 122 or the substrate 10 due to the interference with the through hole 126a. Even when the reacting gas is supplied to the susceptor 122 or the substrate 10, it may be difficult for the reacting gas to reach the susceptor 122 or the substrate 10 while spreading all around. For this reason, the uniformity of the deposited film or compound semiconductor layer 14 may be deteriorated.

The inclined angle A of the side surface of the through hole 126a (that is, the inclined angle of the side surface of the through hole 126a with respect to the side surface of the discharge hole 124c (in particular, an acute angle)) may be within a range of 10-20 degrees. The reacting gas may uniformly spread and may be uniformly supplied to the susceptor 122 or the substrate 10 when the inclined angle A is within the range. If the inclined angle A of the side surface of the through hole 126a is less than 10 degrees, the reacting gas spreads in a fashion similar to the shape of the through hole 126a due to friction with the side surface of the through hole 126a. Hence, it may be difficult for the reacting gas to reach the susceptor 122 or the substrate 10 while widely spreading because the spread angle is small. If the inclined angle of the side surface of the through holes 126a exceeds 20 degrees, the reacting gas reaches the substrate 10 in the jet-flow fashion because there is almost no friction with the side surface of the through holes 126a. Hence, the uniformity of the deposited film may be deteriorated.

The deposition apparatus 100 according to the embodiment is able to form the compound semiconductor layer 14 of a compound semiconductor solar cell in an excellent manner by the metal organic chemical vapor deposition.

The embodiment is able to supply the reacting gas, which is prepared by mixing plural kinds of raw gases with each other, to the substrate 10 placed on the susceptor 122 using the shower head 124. As a result, it is possible to simplify the structure of the apparatus so as to be suitable for a solar cell in which the compound semiconductor layer 14 is formed at a low deposition temperature and to thus reduce the manufacturing costs. Here, it is possible to prevent the temperature of the shower head 124 from being increased during the deposition process by positioning the thermal barrier 126 on the surface of the shower head 124 close to the susceptor 122. Consequently, it is possible to minimize the distance between the shower head 124 and the susceptor 122 and to improve the deposition speed, whereby enabling deposition of the compound semiconductor layer 14 at a high speed. In an example, the deposition speed of the compound semiconductor layer 14 by the deposition apparatus 100 according to the embodiment may be within a range of 10 um/hr-100 um/hr. This value is greatly excellent, compared to a range of 1 um/hr-3 um/hr which is a deposition speed by a conventional metal organic chemical vapor deposition apparatus. Accordingly, it is possible to improve the productivity of the process of manufacturing a solar cell.

Hereinafter, a solar cell and a method of manufacturing the same, according to another embodiment of the present invention, will be described in detail with reference to FIGS. 4 and 5. Since the above description may be directly applied to parts, which are identical or closely similar to the parts of the previous embodiment, the description of the identical or similar parts is omitted, and only parts different from the previous embodiment will be described in detail. Combinations of the previous embodiment or its modification with the following embodiment or its modification shall be also construed as falling within the scope of the present invention.

Figure 4:
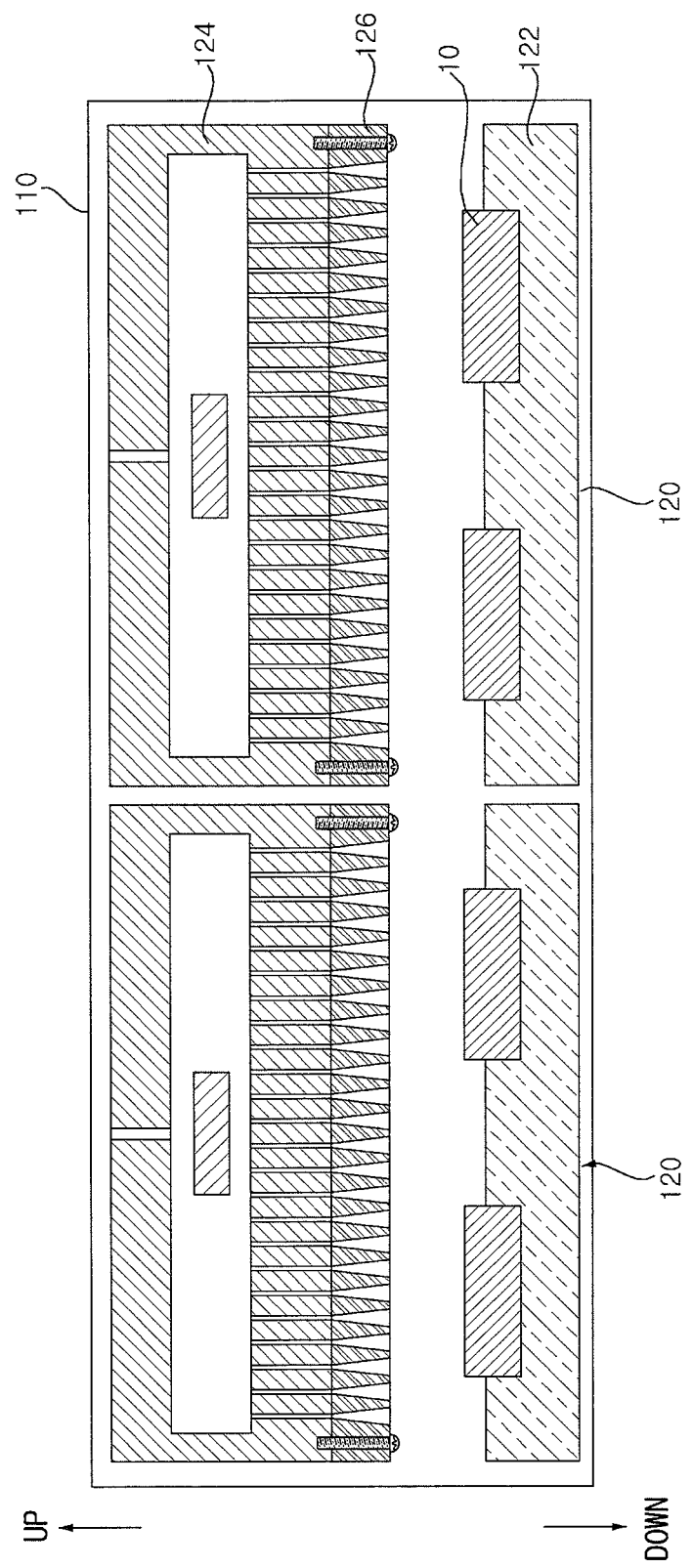
FIG. 4 is a schematic view showing a metal organic chemical vapor deposition apparatus for a solar cell, according to another embodiment of the present invention.

FIG. 4 is a schematic view of a deposition apparatus according to another embodiment of the present invention. For clarity and brevity of illustration, illustration of the heater 130 (see FIG. 2) is omitted.

Referring to FIG. 4, the deposition apparatus 100 according to this embodiment includes a plurality of deposition units 120 disposed in the chamber 110. In this embodiment, the plurality of deposition units 120 may be arranged in the horizontal direction.

In the embodiment, the plurality of deposition units 120, each of which is constituted by the susceptor 122, the shower head 124, the thermal barrier 126 and the like, may be disposed in the chamber 110. According to the method of metal organic chemical vapor deposition according to the embodiment, excellent deposition uniformity may be maintained even when the plurality of deposition units 120 are arranged in the chamber 110. Unlike this embodiment, according to a plasma enhanced chemical vapor deposition, the deposition unit has to be constituted by only one deposition unit in order to uniformly maintain plasma. When a plurality of deposition units are provided, the deposition uniformity may be deteriorated because uniform plasma is not created from the deposition units.

Accordingly, by the provision of a plurality of deposition units 120, each of which is adapted to deposit a small number of substrates 10, it is possible to prevent deterioration of deposition uniformity which may occur when the size of the deposition unit 120 is increased. For example, when the size of the deposition unit 120 is increased, the circumferential portion of the shower head 124 may droop, whereby uniform deposition may be not obtained depending on area of the substrate 10 even in the same deposition unit 120. In this embodiment, the number of substrates 10 disposed in one deposition unit (more precisely, one susceptor 122) may be 4 to 25. More specifically, the number of substrates 10 disposed in one deposition unit 120 or susceptor 122 may be 4 to 9. Accordingly, it is possible to simplify the structure of the deposition units 120 and deposit a large number of substrates 10 at one time by virtue of the plurality of deposition units 120. Consequently, it is possible to remarkably improve the productivity of solar cells.

In this embodiment, the susceptors 122 may not be rotated, as described above. In the case in which the susceptors 122 are not rotated, the deposition uniformity may be relatively deteriorated. Considering this, the plurality of deposition units 120, each of which includes a relatively small number of substrates 10 disposed therein, are provided, and each of the deposition units 120 fulfils the multiple roles of shielding the heat from the susceptor 122, uniformly supplying raw gases and discharging the raw gases, thereby further improving the deposition uniformity.

Figure 5:
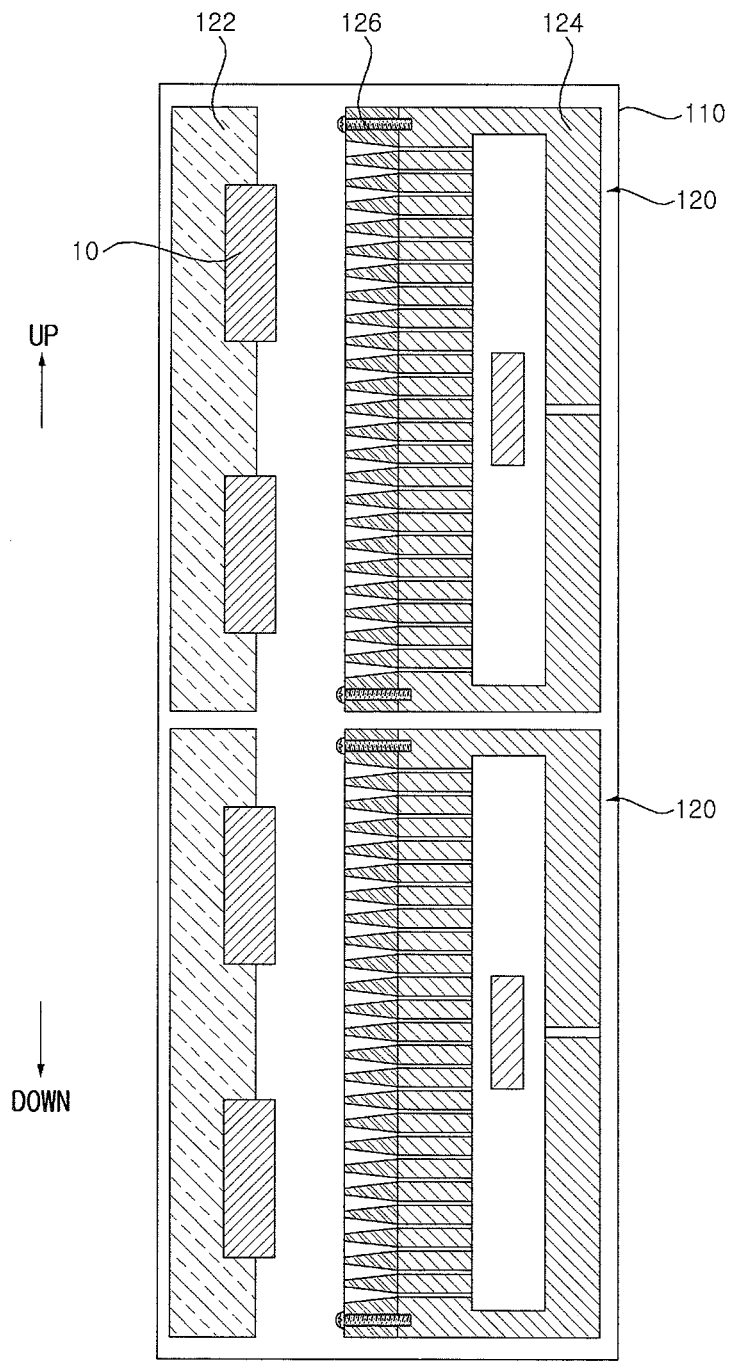
FIG. 5 is a schematic view showing a metal organic chemical vapor deposition apparatus for a solar cell, according to still another embodiment of the present invention.

FIG. 5 is a schematic view of a deposition apparatus according to still another embodiment of the present invention. For clarity and brevity of illustration, illustration of the heater 130 (see FIG. 2) is omitted.

Referring to FIG. 5, this embodiment may minimize the space required for installation of the deposition apparatus 100 by positioning a plurality of deposition units 120 vertically. Therefore, it is possible to remarkably improve the productivity of solar cells. In FIG. 5, a reference to "UP" refers to a higher elevation while a reference to "DOWN" refers to a lower elevation. In embodiments of the present invention, a process gas may be discharged through a shower head 124 laterally.

Various methods may be applied to the method of mounting the substrates 10 on the susceptors 122. For example, it is possible to stably secure the substrates 10 to the susceptors 122 by positioning the susceptors 122 to be inclined with respect to the bottom or by further providing fastening members for securing the substrates 10 to the susceptors 122.

Figure 6:
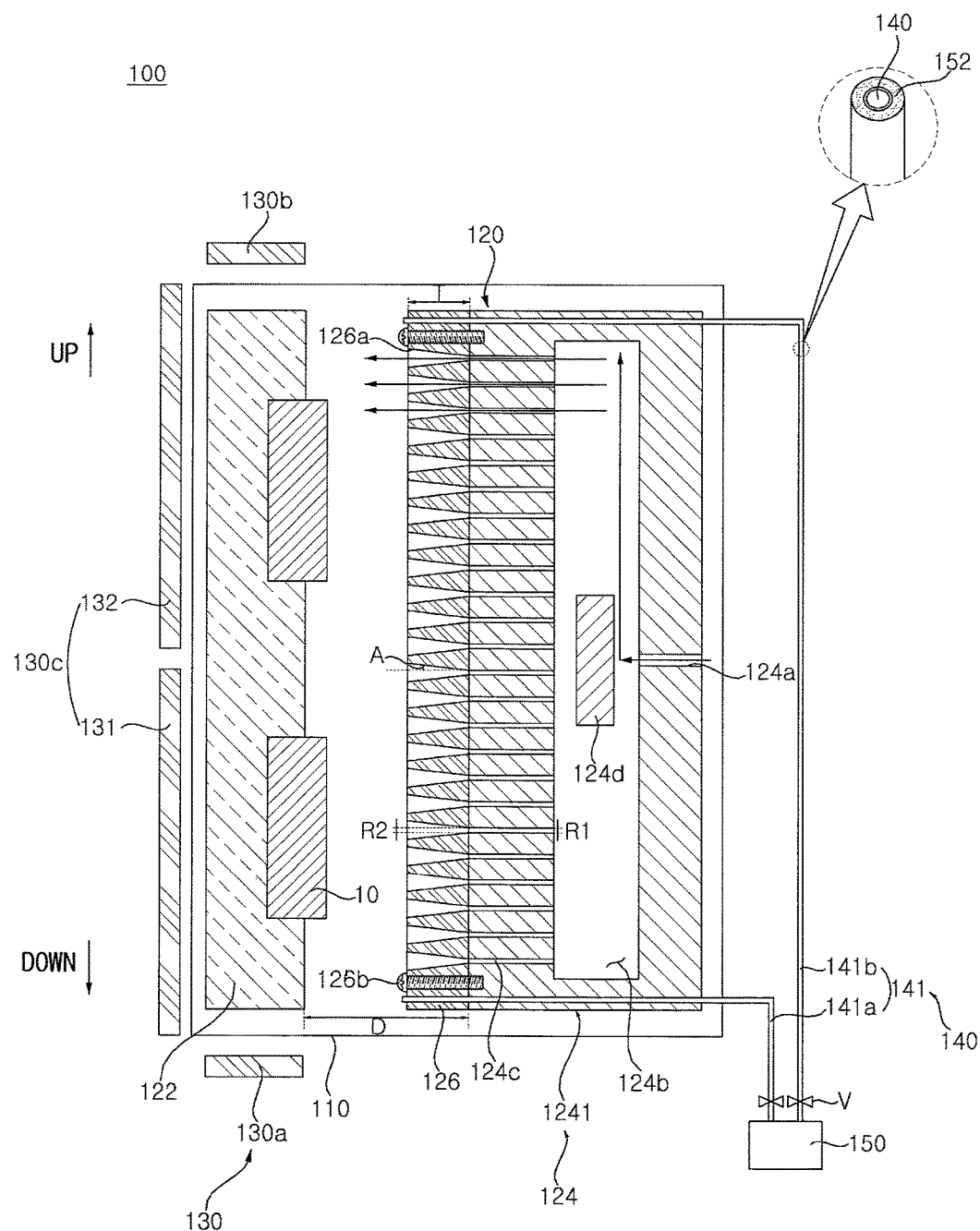
FIG. 6 is a schematic view showing a metal organic chemical vapor deposition apparatus for a solar cell, according to yet another embodiment of the present invention.
Figure 7:
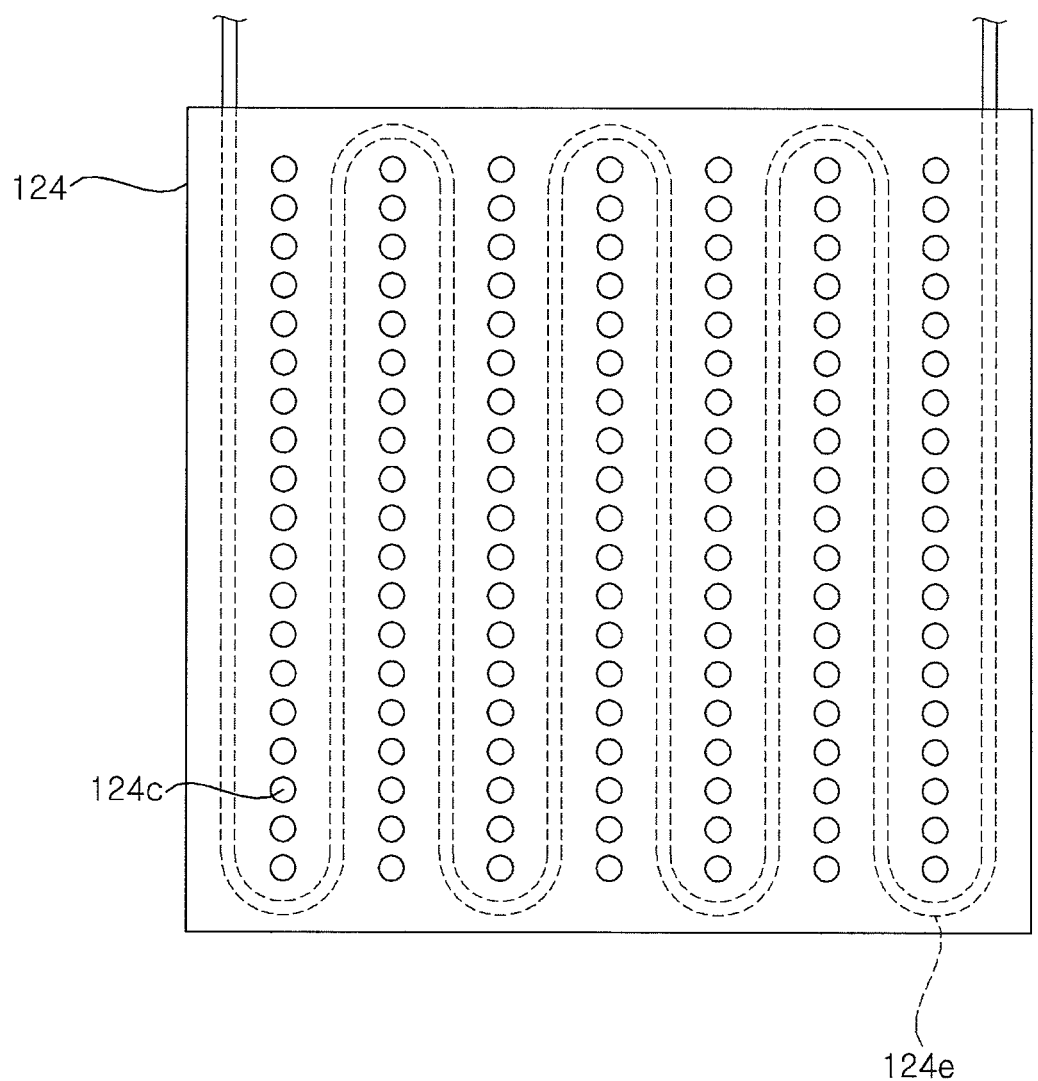
FIG. 7 is a plan view schematically illustrating the cooling structure of the shower head of the metal organic chemical vapor deposition apparatus for a solar cell shown in FIG. 6.

FIG. 6 is a schematic view of a metal organic chemical vapor deposition apparatus for a solar cell, according to yet another embodiment of the present invention. FIG. 7 is a plan view schematically illustrating the cooling structure of the shower head of the metal organic chemical vapor deposition apparatus for a solar cell shown in FIG. 6. FIG. 7 illustrates the surface of the shower head that is close to the susceptor.

Referring to FIG. 6, the deposition apparatus 100 according to this embodiment may be constituted by a vertical metal organic chemical vapor deposition apparatus for a solar cell. Specifically, the deposition apparatus 100 includes the chamber 110, the deposition unit 120 and a plurality of exhaust lines 140, which are connected to the inside of the chamber 110 so as to discharge the gas in the chamber 110 to the outside. Here, the deposition apparatus 100 may be configured to have a vertical structure, and the discharge amount of the exhaust line 140, which is positioned at a lower portion of the chamber 110, may be different from the discharge amount of the exhaust line 140, which is positioned at an upper portion of the chamber 110. The deposition apparatus 100 may further include a heater 130 for heating the susceptor 122. This will be described in more detail below.

Hereinafter, among the parts associated with the chamber 110, the deposition unit 120, the heater 130 and the like, ones which are identical or similar to parts of previous embodiments are omitted, and only ones which are different from parts of the previous embodiments will be described in detail. In the embodiments shown in FIGS. 6 to 9, the deposition unit 120 may or not include the thermal barrier 126.

Although FIG. 6 illustrates an example in which one deposition unit 120 is disposed in the chamber 110, the present is not limited thereto. In other words, a plurality of deposition units 120 may be disposed in the chamber 110. This will be described in detail later with reference to FIGS. 8 and 9.

The deposition process is performed in the state in which the temperature of the substrate 10 placed on the susceptor 122 is increased by heating the susceptor 122.

As shown in FIG. 7, the shower head 124 may include a cooling unit in order to prevent the shower head 124 from being heated. In one example, the shower head 124 may be provided therein with a cooling pipe 124e, through which cooling medium flows, such that the cooling pipe 124e extends through regions near the discharge holes 124c (that is, the regions that face the susceptor 122 or the substrate 10). Accordingly, it is possible to efficiently prevent the shower head 124 from being heated by the simplified structure. The cooling medium may be embodied as cooling water, and the cooling pipe 124e may be configured to have various shapes, structures and the like. Other various modifications are possible.

In this embodiment, the heater 130 may have a structure or disposition capable of improving the deposition uniformity, and this will be described in detail later.

The exhaust line 140, which is connected to the inside of the chamber 110, serves to discharge the gas (or the process gas) in the chamber 110 to the outside. The exhaust line 140 may be configured to have various structures capable of discharging the gas in the chamber 110 to the outside. In one example, the exhaust line 140 may be constituted by a pile connected to a pump 150.

More specifically, in this embodiment, the exhaust line 140 may extend to the space between the susceptor 122 and the shower head 124 through the shower head 126 (the thermal barrier 126 in the case of being equipped with the thermal barrier 126) so as to discharge the process gas present between the susceptor 122 and the shower head 124 to the outside. As a result, it is possible to discharge the gas, which is present in the space between the susceptor 122 and the shower head 124 in which the reaction actually required for deposition occurs, thereby improving the exhaust efficiency. In addition, the control of the discharge amount makes it easy to restrict the imbalance of the process gas present between the susceptor 122 and the shower head 124.

The exhaust line 140 may extend through the circumferential region of the shower head 124. Accordingly, it is possible to efficiently discharge the process gas to the outside through the shortest path without interference with the portions of the shower head 124 for supplying the reacting gas (i.e. the injection port 124a, the discharge holes 124c or the like).

In this embodiment, the exhaust line 140 may be configured to have a structure or disposition capable of improving the deposition uniformity, and this will now be described in detail.

In this embodiment, the susceptor 122 may be positioned to be perpendicular to or inclined with respect to the bottom of the deposition apparatus 100 such that the substrate 10 is mounted in the inclined or vertical state. For the stable mount of the substrate 10, the deposition apparatus may further include an additional holding member. The shower head 124, which is positioned to be parallel to the susceptor 122 and the substrate 10, may also be mounted in the state of being perpendicular to or inclined with respect to the bottom of the deposition apparatus 100. In other words, the deposition apparatus 100 according to this embodiment may be configured to a vertical structure.

When the deposition apparatus 100 is configured to have the vertical structure according to the embodiment, it is possible to prevent the circumferential region of the shower head 124 from drooping downward. In addition, it is possible to reduce the installation area for the deposition apparatus 100 and the installation and maintenance costs. Since particles generated in the deposition process mostly fall by gravity, there is no influence on the substrate 10 and the susceptor 122. Therefore, there is no need for the cleaning operation after the respective deposition processes, thereby reducing the manufacturing costs such as additional labor costs and improving the productivity.

If the deposition apparatus is constructed to have a horizontal structure such that the substrate is mounted to be parallel to the bottom of the deposition apparatus unlike this embodiment, the drooping phenomenon may occur at the circumferential region of the shower head by gravity when the sizes of the susceptor and the shower head are increased in order to improve the productivity. As a result, the distance of the susceptor and the shower head may be decreased at the circumferential region compared to other regions. When the distance between the susceptor and the shower head is irregular, the deposited film or deposition layer, which is deposited on the substrate, may have low deposition uniformity. Accordingly, the horizontal deposition apparatus has a limitation in increasing the size of the susceptor and the shower head. In addition, the horizontal deposition apparatus requires increased installation and maintenance costs due to the increased installation area. Furthermore, since particles, which are generated in the deposition process, fall on the substrate 10 disposed at a low level of the deposition apparatus, the quality of the deposited film or the deposition layer, which is formed on the substrate, may be deteriorated. Since a manual cleaning operation has to be performed in order to prevent the deterioration of quality, the manufacturing costs may be increased and the productivity may be decreased due to the increased labor costs.

Although this embodiment has the above-described advantages by adoption of the vertical structure, there may be a problem whereby the deposition uniformity is deteriorated. Accordingly, this embodiment has a structure for eliminating the problem. More specifically, since the deposition process is performed at a high temperature (e.g. a temperature of 650-800° C.), the specific gravity of the process gas is decreased by being heated, thereby creating a rising current of the process gas. Accordingly, the deposition uniformity may be decreased because the amount of the process gas present around the substrate 10 positioned at an upper level of the chamber 110 is different from the amount of the process gas present around the substrate 10 positioned at a lower level of the chamber 110. In order to prevent this problem, this embodiment may be provided with the plurality of exhaust lines 140, and the discharge amounts may be controlled to be different at upper and lower positions of the exhaust lines 140 such that the process gas is uniformly distributed in the chamber 110. In contrast, since a conventional deposition apparatus is constructed such that a pump is directly connected to a chamber, it is difficult to prevent the imbalanced flow of process gas.

In this embodiment, various structures, manners and the like may be applied in order to make the discharge amounts different from each other. In one example, the plurality of exhaust lines 140 may be provided with respective exhaust shutoff valves V for controlling discharge amount, and the discharge amount may be controlled by variation of opening rate of the exhaust shutoff valve V. By virtue of adoption of the exhaust shutoff valves V, it is possible to control the discharge amount by a simplified structure. In addition, it is also possible to easily control the discharge amount when it is necessary to control the discharge amounts of the exhaust shutoff valves V by variation of the process conditions. However, the present invention is not limited thereto, and the control of discharge amount may be implemented, for example, by differentiating the cross-sectional areas of the exhaust lines 140 from each other.

More specifically, among the plurality of exhaust lines 140, the discharge amount of the exhaust line 140, which is positioned at an upper level of the chamber 110, may be smaller than the discharge amount of the exhaust line 140, which is positioned at a lower level of the chamber 110. In one example, the opening rate of the exhaust line 140, which is positioned at an upper level of the chamber 110, may be less than the opening rate of the exhaust line 140, which is positioned at an upper level of the chamber 110.

As a result, a relatively larger amount of the process gas is discharged through the exhaust line 140, which is positioned at a lower level of the chamber 110 at which a relatively larger amount of process gas is present due to the rising current, and a relatively smaller amount of process gas is discharged through the exhaust line 140, which is positioned at an upper level of the camber 110 at which a relatively smaller amount of process gas is present due to the rising current. Accordingly, the process gas may be uniformly distributed throughout the height of the chamber 110.

This embodiment illustrates an example in which a single first shower head 1241 is disposed in the chamber 110, and a plurality of exhaust lines 141 are disposed in the first shower head 1241. In this case, the plurality of first exhaust lines 141 may include a first lower exhaust line 141a, which is connected to (in particular, extends through) a lower portion (in particular, the lower circumferential region) of the first shower head 1241, and a first upper exhaust line 141a, which is connected to (in particular, extends through) an upper portion (in particular, the upper circumferential region) of the first shower head 1241. Here, the discharge amount from the first upper exhaust line 141b may be smaller than the discharge amount from the lower first exhaust line 141a. In one example, the opening rate of the exhaust shutoff valve V of the first upper exhaust line 141b may be smaller than that of the exhaust shutoff valve V of the first lower exhaust line 141b. Accordingly, it is possible to improve the deposition uniformity by uniformly distributing the process gas in the chamber 110 equipped with one first shower head 1241.

However, the present invention is not limited thereto, and the number of first exhaust lines 141 connected to the first shower head 1241 may be three or more. In this case, the discharge amounts of the plurality of first exhaust lines 141 may be configured to be decreased in a stepwise fashion from the first exhaust line 141 which is positioned at the highest level of the first shower head 1241 toward the first exhaust line 141 which is positioned at the lowest level of the first shower head 1241. For example, the opening rates of the exhaust shutoff valves V may be configured to be decreased in a stepwise fashion from the first exhaust line 141 which is positioned at the lowest level to the first exhaust line 141 which is positioned at the highest level.

In this embodiment, the exhaust lines 140 may be maintained at a temperature which is lower than the inside of the chamber 110 but higher than the ambient temperature. When the temperature of the exhaust lines 140 is low, the process gas (or exhaust gas), which is discharged through the exhaust lines 140, may be adsorbed to the exhaust lines 140. In order to prevent the adsorption, the exhaust lines 140 are maintained at a temperature higher than the ambient temperature.

In order to maintain the temperature of the exhaust lines 140 at a predetermined temperature or higher, various structures, manners and the like may be applied. In one example, as illustrated in the enlarged dotted circle of FIG. 6, the exhaust line 140 may be provided with a jacket heater 152 surrounding the outer surface of the exhaust line 140. By virtue of adoption of the jacket heater 152, it is possible to efficiently heat the exhaust line 140 by the simple structure. Various structures and manners may be applied to or used by the jacket heater 152. In addition to the jacket heater 152, various structures and manners capable of heating the exhaust line 140 may be applied or used.

In one example, the temperature of the exhaust lines 140 may be maintained at a temperature of 300-400° C. If the temperature of the exhaust lines 140 is lower than 300° C., the effect of preventing absorption may be insufficient. If the temperature of the exhaust lines 140 exceeds 400° C., the secondary reaction may occur in the process gas (or exhaust gas), which is discharged through the exhaust lines 140. However, the present invention is not limited thereto, and the exhaust lines 140 may assume different temperatures depending on a material to be deposited, the kind of reacting gas or the like.

In this embodiment, the process gas, which is heated in the deposition process, may be concentrated at an upper position due to the rising current. Hence, an upper region of the chamber 110 may have a higher temperature than a lower region of the chamber 110, thereby causing temperature non-uniformity. In order to prevent this problem, this embodiment may differentiate the structure, disposition or the like of the heater 130.

In this embodiment, the heater 130 may include a plurality of heaters 130 for heating the deposition unit 120 (in particular, the susceptor 122). Here, the heating temperature of the heater 130, which is positioned at an upper level of the chamber 110, may be lower than that of the heater 130, which is positioned at a lower level of the chamber 110.

More specifically, the plurality of heaters 130 may include a lower heater 130a disposed on the lower surface of the lower surface of the chamber 110, an upper heater 130b disposed on the upper surface of the chamber 110, and a side heater 130c disposed on a side surface of the chamber 110. The heating temperature of the side heater 130c may be lower than that of the lower heater 130a, and the heating temperature of the upper heater 130b may be lower than that of the side heater 130c. The plurality of heaters 130 may include a first side heater 131 and a second side heater 132. The second side heater 132 may be positioned higher than the first side heater 131, and the heating temperature of the second side heater 132 may be lower than that of the first side heater 131. Accordingly, it is possible to minimize or prevent temperature non-uniformity, which may occur in the chamber 110.

More specifically, in this embodiment, the heater 130 may include a lamp heater, which is spaced apart from the susceptor 122. The provision of the lamp heater enables heating and cooling in a short period of time, whereby the process time is reduced and the productivity is improved. In addition, since a plurality of heaters 130 may be disposed so as to prevent the temperature non-uniformity, it is possible to efficiently prevent the temperature non-uniformity which may occur in the chamber 110. In particular, since the lamp heater is spaced apart from the susceptor 122, it is possible to partially heat the susceptor 122 rather than to entirely heat the susceptor 122. The lamp heater may be positioned outside the changer 110. Accordingly, it is possible to easily execute the replacement, repair, maintenance or the like of the lamp heater which has a relatively short service life. However, the present invention is not limited thereto. The heater 130 may be constituted by a resistance heater which is positioned inside the susceptor 122. Other various modifications are possible.

The heater 130 may be positioned only at location close to the susceptor 122 so as to heat not the shower head 124 but only the susceptor 122 on which the substrate 10 is mounted.

The heater 130 heats the susceptor 122 such that the substrate 10 mounted on the susceptor 122 reaches a predetermined deposition temperature while the deposition is performed in the deposition apparatus 100. Here, when plural kinds of raw gases are injected into the internal space 124b through the injection port 124a of the shower head 124, the reacting gas, which is prepared by the plural kinds of gases mixed in the internal space 124b, is supplied to the substrate 10 through the discharge holes 124c. Consequently, the reacting gas reaches the substrate 10, which is heated to the deposition temperature, thereby forming deposited film, that is, the compound semiconductor layer 14 on the substrate 10.

The deposition apparatus 100 according to the embodiment may form the compound semiconductor layer 14d for a compound semiconductor solar cell, having excellent properties by the metal organic chemical vapor deposition. In addition, since the deposition apparatus 100 has the vertical structure capable of accommodating a large-sized shower head 124, a large number of substrates 10 may be deposited at one time, and there is no need for cleaning or the like during the deposition process. Therefore, it is possible to improve the productivity.

In this embodiment, the discharge amount of the exhaust line 140 (that is, the first upper exhaust line 141b), which is positioned at an upper level of the chamber 110, is controlled to be smaller than the discharge amount of the exhaust line 140 (that is, the first lower exhaust line 141a), which is positioned at a lower level of the chamber 110. Accordingly, a larger amount of process gas is discharged from a lower part of the chamber 110, and thus, the rising current can be prevented or minimized. Therefore, it is possible to realize the uniform distribution of the process gas in the vertical chamber 110, thereby improving the deposition uniformity.

Figure 8:
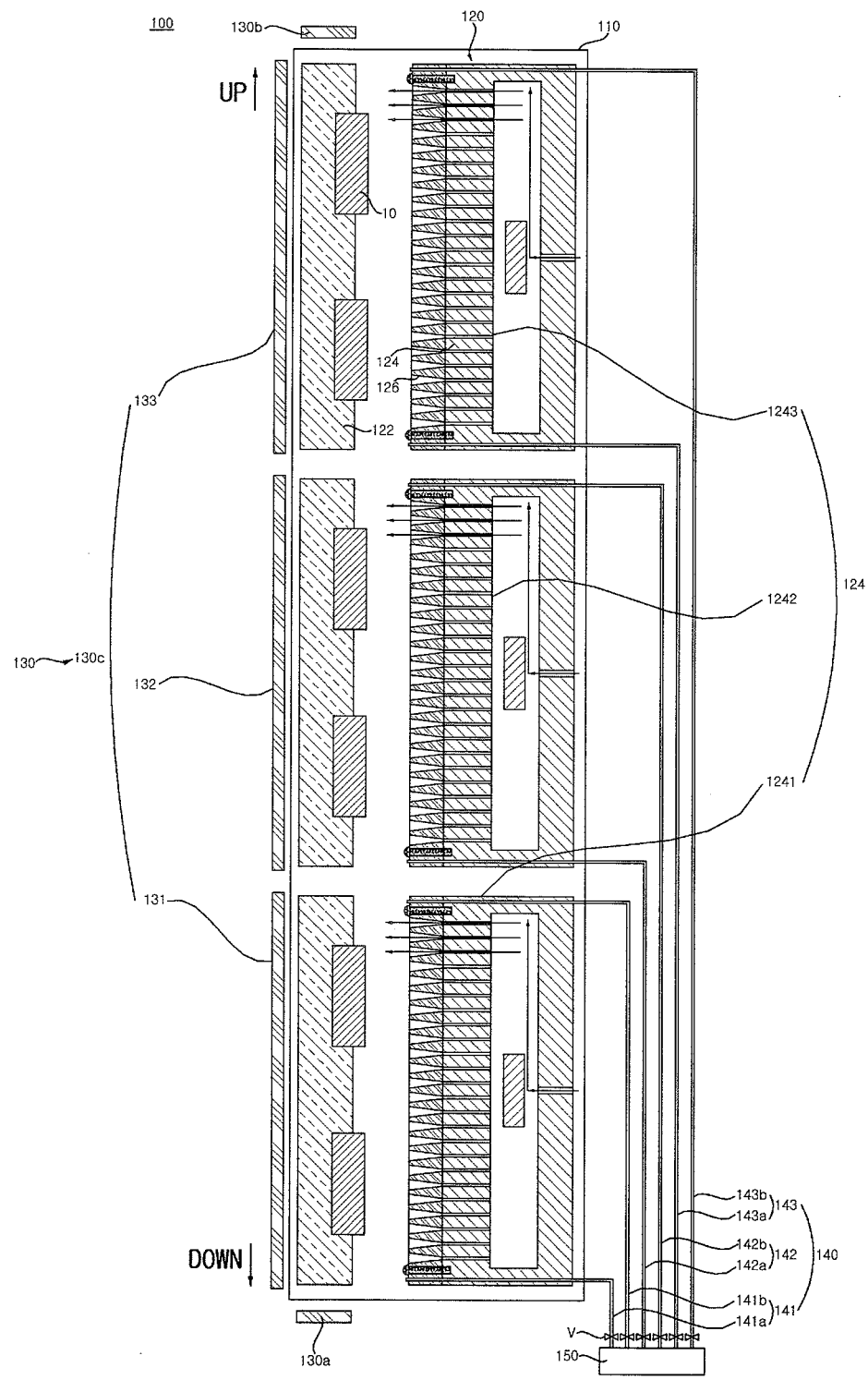
FIG. 8 is a schematic view showing a metal organic chemical vapor deposition apparatus for a solar cell, according to still yet another embodiment of the present invention.

FIG. 8 is a schematic view of a deposition apparatus according to still yet another embodiment of the present invention.

Referring to FIG. 8, the deposition apparatus 100 according to this embodiment includes a plurality of deposition units 120 disposed in the chamber 110. The deposition units 120 may be arranged vertically.

When the plurality of deposition units 120, each of which is adapted to deposit a small number of substrates 10 deposition units 120, are arranged vertically in this way, it is possible to prevent the deterioration of deposition uniformity or the like, which may occur when the size of the deposition units 120 is increased. For example, it is possible to efficiently prevent the deterioration of deposition uniformity or the like, which may occur due to the increased size of the deposition units 120. In one example, the number of substrates 10, which may be disposed on one susceptor 122, may be 4 to 25. More specifically, the number of substrates 10, which may be disposed on one deposition unit 120 or one susceptor 122, may be 4 to 9. Accordingly, since the structure of the deposition units 120 is simplified, it is possible to deposit a large number of substrates 10 at one time by virtue of the plurality of deposition units 120. Consequently, it is possible to greatly improve the productivity of solar cells.

This embodiment may include a plurality of shower heads 124. The drawing illustrates an example in which three deposition units 120 are arranged vertically. Accordingly, the deposition apparatus includes three shower heads 124, that is, a first shower head 1241, a second shower head 1242 disposed above the first shower head 1241, and a third shower head 1243 disposed above the second shower head 1242. However, the present invention is not limited thereto, and it is enough that the number of deposition units 120 or shower heads 124, which are arranged in series in the vertical direction, is two.

In this embodiment, the exhaust line 140 may correspond to the shower heads 124. In other words, the plurality of shower heads 124 may be provided with respective exhaust lines 140 connected thereto. This embodiment may include a first exhaust line 141 connected to the first shower head 1241, a second exhaust line 142 connected to the second shower head 1242, and a third exhaust line 143 connected to the third shower head 1243. Here, the discharge amount of the second exhaust line 142 is smaller than that of the first exhaust line 141, and the discharge amount of the third exhaust line 143 is smaller than that of the second exhaust line 142. Accordingly, it is possible to greatly improve the productivity and to improve the deposition uniformity by virtue of uniform distribution of the process gas.

The number of each of the first exhaust line 141, the second exhaust line 142 and the third exhaust line 143 may be variously modified. In this embodiment, the first exhaust line 141 may include a first lower exhaust line 141a connected to a lower portion of the first shower head 1241 and a first upper exhaust line 141b connected to an upper portion of the first shower head 1241. Similarly to this, the second exhaust line 142 may include a second lower exhaust line 142a connected to a lower portion of the second shower head 1242 and a second upper exhaust line 142b connected to an upper portion of the second shower head 1242. The third exhaust line 143 may include a third lower exhaust line 143a connected to a lower portion of the third shower head 1243 and a third upper exhaust line 143b connected to an upper portion of the third shower head 1243.

Here, the discharge amount of the first upper exhaust line 141b may be smaller than that of the first lower exhaust line 141a, and the discharge amount of the second lower exhaust line 142a may be smaller than that of the first upper exhaust line 141b. The discharge amount of the second upper exhaust line 142b may be smaller than that of the second lower exhaust line 142a, and the discharge amount of the third lower exhaust line 143a may be smaller than that of the second upper exhaust line 142b. The third upper exhaust line 143b may be smaller than that of the third lower exhaust line 143a. In this way, the discharge amount of the exhaust lines may be decreased in a stepwise fashion from the first lower exhaust line 141a disposed at the lowest position to the third upper exhaust line 143b disposed at the highest position.

Consequently, the deposition apparatus 100 can treat a large number of substrates 10 at one time by virtue of accommodation a plurality of deposition units 120, and can offer excellent deposition uniformity.

In this embodiment, the heater 130 may include a lower heater 130a disposed on the lower surface of the chamber 110, an upper heater 130b disposed on the upper surface of the chamber 130, and a side heater 130c disposed on a side surface of the chamber 110. Here, the heating temperature of the side heater 130c may be lower than that of the lower heater 130a, and the heating temperature of the upper heater 130b may be lower than that of the side heater 130c. In this embodiment, the side heater 130c includes a first side heater 131, a second side heater 132 and a third side heater 133, which correspond to respective deposition units 120. Here, the second side heater 132 may be positioned higher than the first heater 131, and the heating temperature of the second side heater 132 may be lower than that of the first side heater 131. The third side heater 133 may be positioned higher than the second side heater 132, and the heating temperature of the third side heater 133 may be lower than that of the second side heater 132. Consequently, the temperature non-uniformity, which may occur in the chamber 110, is minimized or eliminated, thereby enabling the deposition apparatus 100 to have excellent deposition uniformity.

However, the present invention is not limited thereto, and the side heater may be constituted by only one side heater 130c, or may not be in one-to-one correspondence with respective deposition units 120. Other various modifications are possible.

The drawing illustrates an example in which the first shower head 1241, the second shower head 1242 and the third shower head 1243 are physically spaced apart from each other, and the susceptors 122, which correspond to the shower heads, are also physically spaced apart from each other. However, the present invention is not limited thereto.

The first shower head 1241, the second shower head 1242 and the third shower head 1243 may be connected to each other, and the susceptors 122, which correspond to the shower heads, may also be connected to each other. Other various modifications are possible.

As described above, the susceptors 122 may not be rotated. In the case in which the susceptors 122 are not rotated, the deposition uniformity may be relatively deteriorated. Considering this, the plurality of deposition units 120, each of which includes a relatively small number of substrates 10 disposed therein, are provided, and each of the deposition units 120 fulfils the multiple roles of shielding the heat from the susceptor 122, uniformly supplying raw gases and uniformly discharging the raw gases, thereby further improving the deposition uniformity. In particular, since the distribution of process gas in the vertical structure may not be uniform, it is possible to make the distribution of process gas uniform as much as possible by providing a plurality of deposition units 120 each having a relatively small size.

Figure 9:
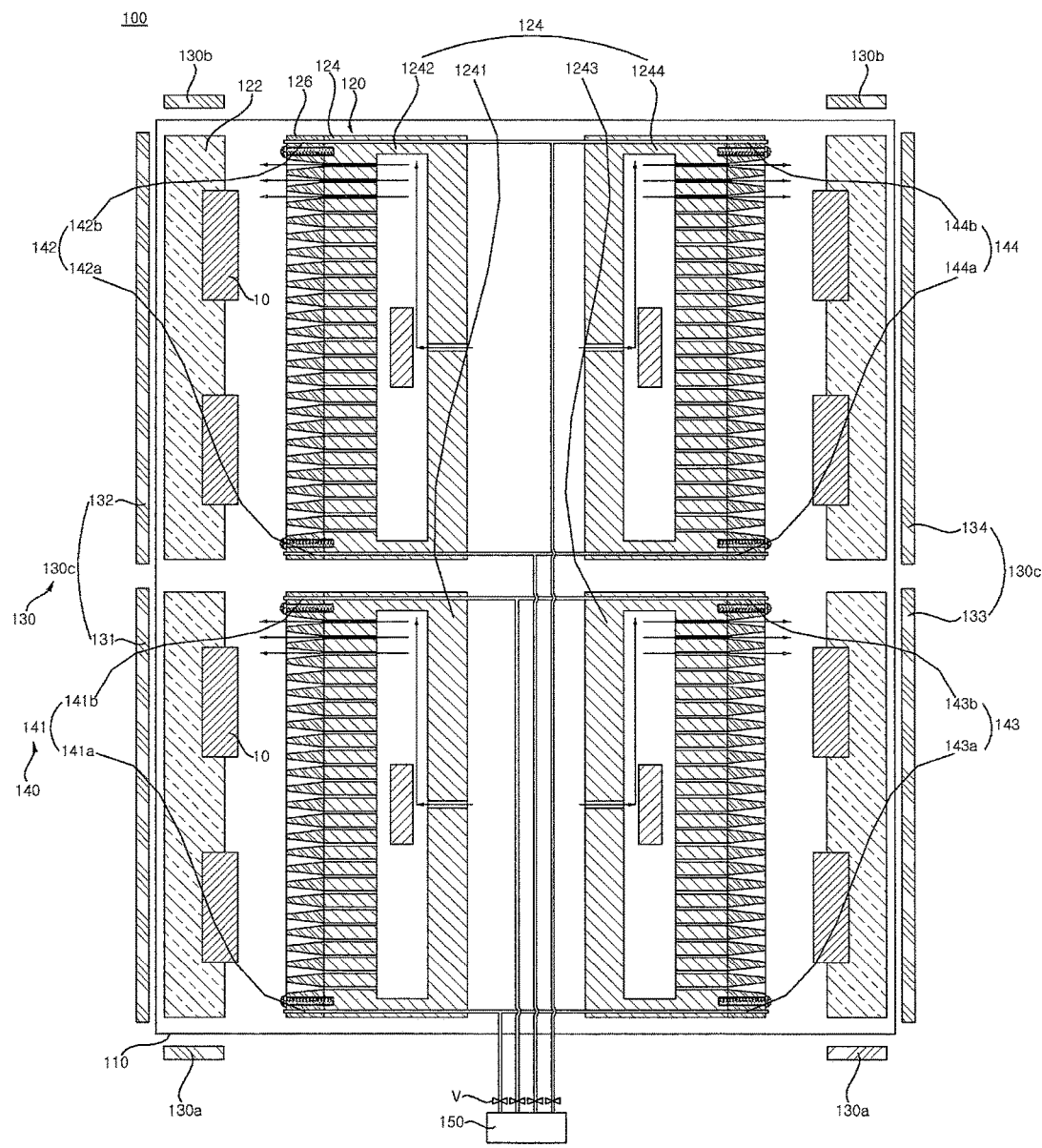
FIG. 9 is a schematic view showing a metal organic chemical vapor deposition apparatus for a solar cell, according to a further embodiment of the present invention.

FIG. 9 is a schematic view of a deposition apparatus according to a further embodiment of the present invention.

Referring to FIG. 9, the deposition apparatus 100 according to this embodiment includes a plurality of deposition units 120 disposed in the chamber 110.

The plurality of deposition units 120 may be disposed in an arrangement in which a plurality of deposition units are arranged vertically and a plurality of deposition units are arranged horizontally. In one example, the drawing illustrates an example in which two deposition units 120 are arranged vertically and two deposition units 120 are arranged horizontally. Accordingly, the deposition apparatus includes a first shower head 1241, a second shower head 1242 disposed above the first shower head 1241, a third shower head 1243 disposed near the first shower head 1241 so as to be positioned at the same level as the first shower head 1241, and a fourth shower head 1244 disposed above the third shower head 1243 so as to be positioned at the same level as the second shower head 1242. However, the present invention is not limited thereto, and two or more shower heads 124 may be arranged in the vertical and/or horizontal directions.

In this embodiment, the exhaust lines 140 may correspond to the plurality of shower heads 124. In other words, the plurality of shower heads 124 may be provided with respective exhaust lines 140. The embodiment may include a first exhaust line 141 connected to the first shower head 1241, a second exhaust line 142 connected to the second shower head 1242, a third exhaust line 143 connected to the third shower head 1243, and a fourth exhaust line 144 connected to the fourth shower head 1244.

Here, the discharge amount of the first exhaust line 141 connected to the first shower head 1241 may be the same as that of the third exhaust line 143 connected to the third shower head 1241 so as to be positioned at the same level as the first exhaust line 141. The discharge amount of the second exhaust line 142 connected to the second shower head 1242 may be the same as that of the fourth exhaust line 144 connected to the fourth shower head 1244 so as to be positioned at the same level as the second exhaust line 142. The discharge amount of the second exhaust line 142 connected to the second shower head 1242 and/or the discharge amount of the fourth exhaust line 144 connected to the fourth shower head 1244 may be smaller than the discharge amount of first exhaust line 141 connected to the first shower head 1241 and/or the discharge amount of the third exhaust line 143 connected to the third shower head 1241. Accordingly, it is possible to greatly improve the productivity and to improve the deposition uniformity by virtue of uniform distribution of the process gas.

Here, the first exhaust line 141 connected to the first shower head 1241 and the third exhaust line 143 connected to the third shower head 1241, which are positioned at the same level, may be connected to each other so as to allow the discharge amount to be controlled by means of one exhaust shutoff valve V. In addition, the second exhaust line 142 connected to the second shower head 1242 and the fourth exhaust line 144 connected to the fourth shower head 1244, which are positioned at the same level, may be connected to each other so as to allow the discharge amount to be controlled by means of one exhaust shutoff valve V. Accordingly, it is possible to simplify the structure of the exhaust line 140 and to more easily control the discharge amount.

The number and position of each of the first exhaust line 141, the second exhaust line 142, the third exhaust line 143 and the fourth exhaust line 144 may be variously modified. In this embodiment, the first exhaust line 141 may include a first lower exhaust line 141*a* connected to a lower portion of the first shower head 1241 and a first upper exhaust line 141*b* connected to an upper portion of the first shower head 1241. Similarly to this, the second exhaust line 142 may include a second lower exhaust line 142*a* connected to a lower portion of the second shower head 1242 and a second upper exhaust line 142*b* connected to an upper portion of the second shower head 1242. The third exhaust line 143 may include a third lower exhaust line 143*a* connected to a lower portion of the third shower head 1243 and a third upper exhaust line 143*b* connected to an upper portion of the third shower head 1243. The fourth exhaust line 144 may include a fourth lower exhaust line 144*a* connected to a lower portion of the fourth shower head 1244 and a fourth upper exhaust line 144*b* connected to an upper portion of the fourth shower head 1244.

The discharge amount of the first lower exhaust line 141*a* and the discharge amount of the third lower exhaust line 143*a* which is positioned at the same level as the first lower exhaust line 141*a* may be the same. The discharge amount of the first upper exhaust line 141*b* and the discharge amount of the third upper exhaust line 143*b* which is positioned at the same level as the first upper exhaust line 141*b* may be the same. The discharge amount of the second lower exhaust line 142*a* and the discharge amount of the fourth lower exhaust line 144*a* which is positioned at the same level as the second lower exhaust line 142*a* may be the same. The discharge amount of the second upper exhaust line 142*b* and the discharge amount of the fourth upper exhaust line 144*b* which is positioned at the same level as the second upper exhaust line 142*b* may be the same.

The discharge amount of the first upper exhaust line 141*b* and/or the discharge amount of the third upper exhaust line 143*b* may be smaller than the discharge amount of the first lower exhaust line 141*a* and/or the discharge amount of the third lower exhaust line 143*a*. The discharge amount of the second lower exhaust line 142*a* and/or the discharge amount of the fourth lower exhaust line 144*a* may be smaller than the discharge amount of the first upper exhaust line 141*b* and/or the discharge amount of the third upper exhaust line 143*b*. The discharge amount of the second upper exhaust line 142*b* and/or the discharge amount of the fourth upper exhaust line 144*b* may be smaller than the discharge amount of the second lower exhaust line 142*a* and/or the discharge amount of the fourth lower exhaust line 144*a*. Accordingly, it is possible to greatly improve the productivity and to improve the deposition uniformity by virtue of uniform distribution of the process gas.

Here, the first lower exhaust line 141*a* and the third lower exhaust line 143*a*, which are positioned at the same level, may be connected to each other so as to allow the discharge amount to be controlled by means of one exhaust shutoff valve V. The first upper exhaust line 141*b* and the third upper exhaust line 143*b*, which are positioned at the same level, may be connected to each other so as to allow the discharge amount to be controlled by means of one exhaust shutoff valve V. The second lower exhaust line 142*a* and the fourth lower exhaust line 144*a*, which are positioned at the same level, may be connected to each other so as to allow the discharge amount to be controlled by means of one exhaust shutoff valve V. The second upper exhaust line 142*b* and the fourth upper exhaust line 144*b*, which are positioned at the same level, may be connected to each other so as to allow the discharge amount to be controlled by means of one exhaust shutoff valve V. Accordingly, it is possible to simplify the structure of the exhaust line 140 and to more easily control the discharge amount.

Consequently, the deposition apparatus 100 can treat a large number of substrates 10 at one time by virtue of accommodation of a plurality of deposition units 120, and can offer excellent deposition uniformity.

The heater 130 may include a lower heater 130*a* disposed on the lower surface of the chamber 110, an upper heater 130*b* disposed on the upper surface of the chamber 130, and a side heater 130*c* disposed on a side surface of the chamber 110. Here, the heating temperature of the side heater 130*c* may be lower than that of the lower heater 130*a*, and the heating temperature of the upper heater 130*b* may be lower than that of the side heater 130*c*. In this embodiment, the side heater 130*c* includes a first side heater 131, a second side heater 132, a third side heater 133 and a fourth side heater 134, which correspond to respective deposition units 120. The second side heater 132 may be positioned higher than the first heater 131, and the heating temperature of the second side heater 132 may be lower than that of the first side heater 131. The fourth side heater 134 may be positioned higher than the third side heater 133, and the heating temperature of the fourth side heater 134 may be lower than that of the third side heater 133. The heating temperatures of the first side heater 131 and the third side heater 133 may be the same, and the heating temperatures of the second side heater 132 and the fourth side heater 134 may be the same. Consequently, the temperature non-uniformity, which may occur in the chamber 110, is minimized or eliminated, thereby enabling the deposition apparatus 100 to have excellent deposition uniformity.

However, the present invention is not limited thereto, and the side heater may be constituted by only one side heater 130*c*, or may not be in one-to-one correspondence with respective deposition units 120. Other various modifications are possible.

In this embodiment shown in the drawing, the first shower head 1241 and the third shower head 1243 may be positioned to be close to the center, and the susceptors 122, which correspond to the first and third shower heads 1241 and 1243, may be positioned at one side of the chamber 110. Similarly to this, the second shower head 1242 and the fourth shower head 1244 may be positioned to be close to the center, and the susceptors 122, which correspond to the second and fourth shower heads 1242 and 1244, may be positioned at the other side of the chamber 110. Accordingly, the deposition apparatus 100 may be configured symmetrically with respect to the imaginary vertical center line.

Therefore, since the susceptors 122, on which the substrates 10 are mounted, are positioned on side surfaces of the chamber 110, the susceptors 122 can be easily heated.

The drawing illustrates an example in which the first shower head 1241, the second shower head 1242, the third shower head 1243 and the fourth shower head 1244 are physically spaced apart from each other, and the susceptors 122, which correspond to the shower heads, are also physically spaced apart from each other. However, the present invention is not limited thereto. The first shower head 1241, the second shower head 1242, the third shower head 1243 and the fourth shower head 1244 may be connected to each other, and the susceptors 122, which correspond to the shower heads, may also be connected to each other. Other various modifications are possible.

As is apparent from the above description, the deposition apparatus according to the embodiments is able to supply reacting gas, which is prepared by mixing plural kinds of raw gases, to a susceptor using a shower head. As a result, it is possible to simplify the structure of the apparatus so as to be suitable for a solar cell in which the compound semiconductor layer is formed at a low deposition temperature and to thus reduce the manufacturing costs. Here, it is possible to prevent the temperature of the shower head from being increased during the deposition process by positioning a thermal barrier on the surface of the shower head close to the susceptor. Consequently, it is possible to minimize the distance between the shower head and the susceptor and to improve the deposition speed, thereby enabling deposition of the compound semiconductor layer at a high speed. Therefore, it is possible to improve the productivity of solar cells.

When the deposition apparatus is configured to have a vertical structure, it is possible to form a large number of compound semiconductor layers of a solar cell in a single process by increasing the size of the shower head or providing the shower heads to two sides of the apparatus. Furthermore, since particles and the like fall down in the vertical structure, there is no need for cleaning during the deposition process, thereby improving the productivity. In the vertical structure, rising current, which is opposed to gravity, is generated due to high temperature. In order to solve the gas imbalance, the discharge amount of an exhaust line, which is positioned at an upper level of a chamber is controlled to be smaller than that of an exhaust line, which is positioned at a lower level of the chamber. Accordingly, when a large amount of process gas is discharged, the rising current can be prevented or minimized. Therefore, it is possible to realize the uniform distribution of the process gas in the vertical chamber, thereby improving the deposition uniformity.

The features, structures, effects, etc., as described above are included in at least one embodiment, and are not limited to a particular embodiment. In addition, although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A metal organic chemical vapor deposition apparatus for forming layers of a solar cell, the metal organic chemical vapor deposition apparatus comprising:
   a deposition unit comprising:
   a susceptor configured to be mounted with a substrate;
   a shower head configured to prepare a reacting gas by mixing plural kinds of raw gases for deposition on the substrate and supply the reacting gas to the susceptor; and
   a thermal barrier, which is disposed on a surface of the shower head that faces the susceptor, the entire thermal barrier being located between the susceptor and the shower head,
   wherein the thermal barrier has a first opening at one surface of the thermal barrier and a second opening having a different size from that of the first opening at another surface of the thermal barrier,
   wherein the shower head includes an injection port, an internal space and a discharge hole, and
   wherein the thermal barrier includes a through hole communicating with the discharge hole,
   wherein the injection port includes one injection port through which the plural kinds of raw gases are injected all together,
   wherein the through hole has a diameter or cross-sectional area, which is gradually increased from a portion thereof which is positioned close to the discharge hole to a portion thereof which is positioned opposite the discharge hole,
   wherein the through hole has a conical shape,
   wherein a ratio of a diameter of a portion of the through hole close to the discharge hole to a diameter of the discharge hole is within a range of 90-110%,
   wherein a side surface of the through hole has an inclined angle of 10-20 degrees,
   wherein the discharge hole has a diameter of 100 um-1 mm, and
   wherein the discharge hole includes a plurality of discharge holes and the through hole includes a plurality of through holes such that the plurality of discharge holes are in one-to-one correspondence with the plurality of through holes, or the plurality of discharge holes are arranged at a density of $2/cm^2$-$10/cm^2$.

2. The metal organic chemical vapor deposition apparatus according to claim 1, wherein a thermal conductivity of the thermal barrier is lower than that of the shower head, or
   thermal conductivity of the thermal barrier is lower than that of the susceptor, or
   the thermal barrier includes ceramic or quartz.

3. The metal organic chemical vapor deposition apparatus according to claim 1, further comprising a chamber defining therein an internal space in which the deposition unit is disposed,
   wherein the deposition unit includes a plurality of deposition units disposed in the chamber.

4. The metal organic chemical vapor deposition apparatus according to claim 3, wherein each of the plurality of deposition units is configured to be provided with 4 to 25 substrates.

5. The metal organic chemical vapor deposition apparatus according to claim 1, further comprising a chamber defining therein an internal space in which the deposition unit is disposed,
   wherein the deposition unit, which is provided with the shower head for supplying the reacting gas, includes a plurality of exhaust lines which are connected to an inside of the chamber and through which a process gas in the chamber is discharged to an outside,
   wherein the susceptor in the chamber is configured to mount the substrate to be inclined or perpendicular to a bottom of the chamber, and wherein a discharge amount of one of the plurality of exhaust lines, which is positioned at an upper portion of the chamber, is smaller than a discharge amount of another one of the plurality of exhaust lines, which is positioned at a lower portion of the chamber.

6. The metal organic chemical vapor deposition apparatus according to claim 5, wherein the plurality of exhaust lines include three or more exhaust lines, and discharge amounts of the plurality of exhaust lines are decreased in a stepwise fashion from one of the plurality of exhaust lines positioned at a lowest level of the chamber to another one of the plurality of exhaust lines positioned at a highest level of the chamber.

7. The metal organic chemical vapor deposition apparatus according to claim 5, wherein the plurality of exhaust lines are provided with a respective exhaust shutoff valve for controlling a discharge amount, and wherein the discharge amount is controlled by an opening rate of the exhaust shutoff valves provided in the plurality of exhaust lines.

8. The metal organic chemical vapor deposition apparatus according to claim 5, wherein the shower head includes a first shower head, wherein the plurality of exhaust lines include a first exhaust line connected to the first shower head, wherein the first exhaust line includes a first lower exhaust line connected to a lower portion of the first shower head and a first upper exhaust line connected to an upper portion of the first shower head, and wherein a discharge amount of the first upper exhaust line is smaller than that of the first lower exhaust line.

9. The metal organic chemical vapor deposition apparatus according to claim 5, wherein the shower head includes a first shower head and a second shower head positioned above the first shower head, wherein the plurality of exhaust lines include a first exhaust line connected to the first shower head and a second exhaust line connected to the second shower head, and wherein a discharge amount of the second exhaust line is smaller than that of the first exhaust line.

10. The metal organic chemical vapor deposition apparatus according to claim 9, wherein the shower head includes a third shower head, which is positioned at the same level as the first shower head, and wherein the first exhaust line connected to the first shower head and the second exhaust line connected to the second shower head, which are positioned at the same level, are connected to each other, and are controlled by one exhaust valve.

11. The metal organic chemical vapor deposition apparatus according to claim 5, wherein the plurality of exhaust lines extend to a location between the susceptor and the shower head through the shower head so as to discharge the process gas, and wherein the plurality of exhaust lines extend through a circumferential region of the shower head.

12. The metal organic chemical vapor deposition apparatus according to claim 5, further comprising a plurality of heaters for heating the susceptor, wherein a heating temperature of one of the plurality of heaters positioned at an upper portion of the chamber is lower than a heating temperature of another one of the plurality of heaters positioned at a lower portion of the chamber.

13. The metal organic chemical vapor deposition apparatus according to claim 12, wherein the plurality of heaters are positioned so as to be spaced apart from the susceptor.

14. The metal organic chemical vapor deposition apparatus according to claim 13, wherein the plurality of heaters are positioned outside the chamber, and wherein the plurality of heaters include a lamp heater or the chamber includes a quartz glass.

* * * * *